(12) United States Patent
Baek et al.

(10) Patent No.: US 12,161,010 B2
(45) Date of Patent: Dec. 3, 2024

(54) ELECTROLUMINESCENT DISPLAY DEVICE INCLUDING AN AUXILIARY PATTERN BETWEEN A CONNECTION PATTERN AND A SECOND ELECTRODE

(71) Applicant: LG DISPLAY CO., LTD., Seoul (KR)

(72) Inventors: Heume-Il Baek, Paju-si (KR); Jun-Ho Youn, Paju-si (KR); Jeong-Mook Choi, Paju-si (KR); Hee-Tae Lim, Paju-si (KR); Ji-Ho Kang, Paju-si (KR); Kyoung-Ji Bae, Paju-si (KR); Jin-Ah Kwak, Paju-si (KR); Sang-Bin Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 456 days.

(21) Appl. No.: 17/515,780

(22) Filed: Nov. 1, 2021

(65) Prior Publication Data

US 2022/0173351 A1 Jun. 2, 2022

(30) Foreign Application Priority Data

Nov. 30, 2020 (KR) .......................... 10-2020-0164874
Sep. 29, 2021 (KR) .......................... 10-2021-0128816

(51) Int. Cl.
*H01L 29/08* (2006.01)
*C08L 79/00* (2006.01)
(Continued)

(52) U.S. Cl.
CPC ............ *H10K 50/824* (2023.02); *C08L 79/00* (2013.01); *H10K 59/122* (2023.02); *H10K 2102/351* (2023.02)

(58) Field of Classification Search
CPC ............... H10K 50/824; H10K 59/122; H10K 2102/251; C08L 79/00
(Continued)

(56) References Cited

U.S. PATENT DOCUMENTS 7,888,864 B2    2/2011  Young
8,094,096 B2    1/2012  Okumoto
(Continued)

FOREIGN PATENT DOCUMENTS

CN    107430301 B    2/2021
CN    112928142 A  *  6/2021  ......... H01L 27/3246
(Continued)

OTHER PUBLICATIONS

Examination Report dated Nov. 29, 2022, issued by the UK Intellectual Property Office in corresponding UK Patent Application No. GB 2115961.1.
(Continued)

*Primary Examiner* — Phuc T Dang
(74) *Attorney, Agent, or Firm* — Morgan, Lewis & Bockius LLP

(57) ABSTRACT

An electroluminescent display device includes: a substrate, a first electrode on the substrate, a connection pattern on the substrate, the connection pattern including a same material as the first electrode, a bank covering edges of the first electrode and the connection pattern, a light-emitting layer on the first electrode, a second electrode on the light-emitting layer, the bank, and the connection pattern, and an auxiliary pattern between the connection pattern and the second electrode, the auxiliary pattern including one or more of: a metal oxide, conductive nanoparticles, and a work function-modifying polymer.

20 Claims, 17 Drawing Sheets

(51) Int. Cl.
*H10K 50/824* (2023.01)
*H10K 59/122* (2023.01)
*H10K 102/00* (2023.01)

(58) Field of Classification Search
USPC .......................................................... 257/40
See application file for complete search history.

(56) References Cited

U.S. PATENT DOCUMENTS

| | | |
|---|---|---|
| 8,362,694 B2 | 1/2013 | Hanawa |
| 8,748,897 B2 | 6/2014 | Choi et al. |
| 9,590,212 B2 | 3/2017 | Matsumoto et al. |
| 10,147,769 B2 | 12/2018 | Lee et al. |
| 2006/0108914 A1 | 5/2006 | Young |
| 2009/0302751 A1 | 12/2009 | Hanawa |
| 2010/0302221 A1 | 12/2010 | Okumoto |
| 2014/0183501 A1 | 7/2014 | Kim et al. |
| 2015/0090989 A1 | 4/2015 | Matsumoto et al. |
| 2015/0137097 A1 | 5/2015 | Choi et al. |
| 2016/0093680 A1 | 3/2016 | Paek et al. |
| 2016/0155982 A1 | 6/2016 | Jeong et al. |
| 2018/0006264 A1 | 1/2018 | Lee et al. |
| 2018/0158878 A1 | 6/2018 | Lee et al. |
| 2018/0190739 A1 | 7/2018 | Paek et al. |
| 2019/0181345 A1* | 6/2019 | Hwang ............... H10K 50/813 |
| 2019/0334125 A1 | 10/2019 | Hosono et al. |
| 2021/0175460 A1 | 6/2021 | Baek |
| 2022/0344610 A1 | 10/2022 | Asaoka et al. |

FOREIGN PATENT DOCUMENTS

| | | | |
|---|---|---|---|
| JP | 2006-505908 A | 2/2006 | |
| JP | 2009-295479 A | 12/2009 | |
| JP | 2012-018938 A | 1/2012 | |
| JP | 2015-069854 A | 4/2015 | |
| JP | 2018-097361 A | 6/2018 | |
| JP | 2019-114620 A | 7/2019 | |
| KR | 20130061564 A * | 6/2013 | ........... G06F 3/0446 |
| KR | 10-2015-0058757 A | 5/2015 | |
| KR | 10-2016-0047110 A | 5/2016 | |
| KR | 10-2018-0077439 A | 7/2018 | |
| KR | 10-2019-0064051 A | 6/2019 | |
| KR | 10-2227722 B1 | 3/2021 | |
| KR | 20210052700 A * | 5/2021 | ........... H10K 59/131 |
| WO | 2021/053813 A1 | 3/2021 | |

OTHER PUBLICATIONS

Office Action dated Sep. 29, 2022, issued by the Japanese Patent Office in corresponding Japanese Patent Application No. 2021-190663.
Examination Report dated Jun. 9, 2022, issued by the India Patent Office in corresponding Indian Patent Application No. 202114051499.
Combined Search and Examination Report dated May 5, 2022, issued in corresponding UKIPO Application No. GB2115961.1.
Office Action issued Apr. 12, 2024 for German Patent Application No. 102021129221.2 (See English Translation) (Note: US 2016/0093680 A1 & JP 2019-114620 A were cited in a prior IDS.).

* cited by examiner

ELECTROLUMINESCENT DISPLAY DEVICE INCLUDING AN AUXILIARY PATTERN BETWEEN A CONNECTION PATTERN AND A SECOND ELECTRODE

CROSS-REFERENCE TO RELATED APPLICATION(S)

This application claims the benefit of and priority to Korean Patent Application No. 10-2020-0164874, filed on Nov. 30, 2020, and No. 10-2021-0128816, filed on Sep. 29, 2021, the entirety of each of which is hereby incorporated by reference.

BACKGROUND

1. Technical Field

The present disclosure relates to an electroluminescent display device, and more particularly, to an electroluminescent display device having a large size and high definition.

2. Discussion of the Related Art

As one of flat panel display devices, an electroluminescent display device has wide viewing angles, as compared with a liquid crystal display device, because it is self-luminous. The electroluminescent display device also has advantages of a thinness, light weight, and low power consumption because a backlight unit is not necessary.

In addition, the electroluminescent display device is driven by low voltages of direct current (DC), and has a fast response time. Further, the electroluminescent display device is strong against the external impacts, and is used in a wide range of temperatures because its components are solids. Also, the electroluminescent display device can be manufactured at low cost.

The electroluminescent display device includes a plurality of pixels, each of which has red, green, and blue sub-pixels, and displays various color images by allowing the red, green, and blue sub-pixels to selectively emit light. The red, green and blue sub-pixels have red, green, and blue light-emitting layers, respectively. Each light-emitting layer is formed through a vacuum thermal evaporation process in which a luminous material is selectively deposited using a fine metal mask (FMM). However, the evaporation process increases manufacturing costs due to preparation of the mask, and has a problem in application to a large-sized and high-definition display device due to manufacturing variations, sagging, shadow effect of the mask, and the like.

SUMMARY

Accordingly, the present disclosure is directed to an electroluminescent display device that substantially obviates one or more of the issues due to limitations and disadvantages of the related art.

An object of the present disclosure is to provide an electroluminescent display device having a large size and high definition.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescent display device, including: a substrate, a first electrode on the substrate, a connection pattern on the substrate, the connection pattern including a same material as the first electrode, a bank covering edges of the first electrode and the connection pattern, a light-emitting layer on the first electrode, a second electrode on the light-emitting layer, the bank, and the connection pattern, and an auxiliary pattern between the connection pattern and the second electrode, the auxiliary pattern including one or more of: a metal oxide, conductive nanoparticles, and a work function-modifying polymer.

In another aspect, there is provided an electroluminescent display device, including: a substrate, a first electrode on the substrate, a connection pattern on the substrate, the connection pattern including a same material as the first electrode, a bank covering edges of the first electrode and the connection pattern, a light-emitting layer on the first electrode, a second electrode on the light-emitting layer, the bank, and the connection pattern, and an auxiliary pattern between the connection pattern and the second electrode, wherein the connection pattern has a protrusion, and wherein the protrusion is disposed within the auxiliary pattern.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages may be discussed below in conjunction with embodiments of the disclosure. It is to be understood that both the foregoing general description and the following detailed description of the present disclosure may be examples and explanatory, and may be intended to provide further explanation of the disclosure as claimed.

BRIEF DESCRIPTION OF THE DRAWINGS

The accompanying drawings, that may be included to provide a further understanding of the disclosure and may be incorporated in and constitute a part of this disclosure, illustrate embodiments of the disclosure and together with the description serve to explain various principles of the disclosure.

Figure 1:
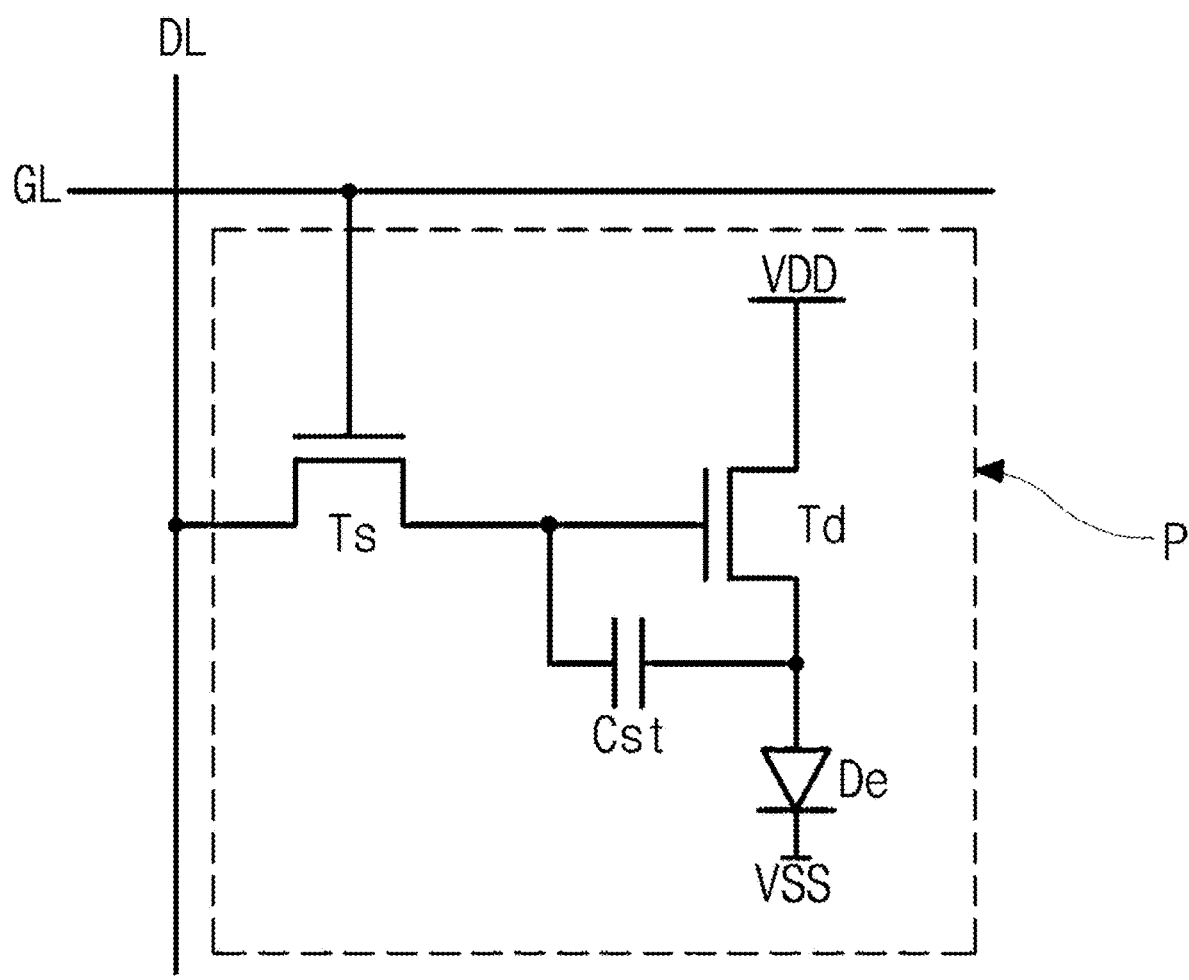
FIG. 1 is a circuit diagram of one pixel region of an electroluminescent display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments may be provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure may be merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. When terms "include," "have," and "include" described in the present disclosure may be used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case that is not continuous may be included, unless a more limiting term, such as "just," "immediate(ly)," or "direct(ly)," is used.

It will be understood that, although the terms "first," "second," etc. May be used herein to describe various elements, these elements should not be limited by these terms. These terms may be only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms may be merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings may be given merely for the convenience of description, and embodiments of the present disclosure may be not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, example embodiments of the present disclosure will be described in detail with reference to the accompanying drawings.

An electroluminescent display device according to an embodiment of the present disclosure may include a plurality of pixels to display an image, and each of the plurality of pixels may include red, green, and blue sub-pixels. A pixel region corresponding to each sub-pixel can have a configuration shown in the example of FIG. 1.

FIG. 1 is a circuit diagram of one pixel region of an electroluminescent display device according to an embodiment of the present disclosure.

In FIG. 1, the electroluminescent display device according to the embodiment of the present disclosure may include a plurality of gate lines and a plurality of data lines crossing each other to define a plurality of pixel regions. For example, in the example of FIG. 1, a gate line GL and a data line DL cross each other to define a pixel region P. A switching thin-film transistor Ts, a driving thin-film transistor Td, a storage capacitor Cst, and a light-emitting diode De may be formed in each pixel region P.

For example, a gate electrode of the switching thin-film transistor Ts may be connected to the gate line GL, and a source electrode of the switching thin-film transistor Ts may be connected to the data line DL. A gate electrode of the driving thin-film transistor Td may be connected to a drain electrode of the switching thin-film transistor Ts, and a source electrode of the driving thin-film transistor Td may be connected to a high voltage supply VDD. An anode of the light-emitting diode De may be connected to a drain electrode of the driving thin-film transistor Td, and a cathode of the light-emitting diode De may be connected to a low voltage supply VSS. The storage capacitor Cst may be connected to the gate electrode and the drain electrode of the driving thin-film transistor Td.

The electroluminescent display device may be driven to display an image. For example, when the switching thin-film transistor Ts is turned on by a gate signal applied through the gate line GL, a data signal from the data line DL may be applied to the gate electrode of the driving thin-film transistor Td and an electrode of the storage capacitor Cst through the switching thin-film transistor Ts.

When the driving thin-film transistor Td is turned on by the data signal, an electric current flowing through the light-emitting diode De may be controlled, thereby displaying an image. The light-emitting diode De may emit light due to the current supplied through the driving thin-film transistor Td from the high voltage supply VDD.

For example, the amount of the current flowing through the light-emitting diode De may be proportional to the magnitude of the data signal, and the intensity of light emitted by the light-emitting diode De may be proportional to the amount of the current flowing through the light-emitting diode De. Thus, the pixel regions P may show different gray levels depending on the magnitude of the data signal. As a result, the electroluminescent display device may display an image.

In addition, the storage capacitor Cst may maintain charges corresponding to the data signal for a frame when the switching thin-film transistor Ts is turned off. Accordingly, even if the switching thin-film transistor Ts is turned off, the storage capacitor Cst may allow the amount of the current flowing through the light-emitting diode De to be constant, and the gray level shown by the light-emitting diode De to be maintained until a next frame.

One or more thin-film transistors and/or capacitors can be added in the pixel region P, in addition to the switching and driving thin-film transistors Ts and Td and the storage capacitor Cst. For example, in the electroluminescent display device, the driving thin-film transistor Td may be turned on for a relatively long time while the data signal may be applied to the gate electrode of the driving thin-film transistor Td and the light-emitting diode De may emit light, to thereby display the gray level. The driving thin-film transistor Td can deteriorate due to application of the data signal for a long time. Therefore, the mobility and/or threshold voltage Vth of the driving thin-film transistor Td may be changed. Thus, the pixel region P of the electroluminescent display device may display a different gray level with respect to the same data signal. This may cause non-uniform luminance, thereby lowering the image quality of the electroluminescent display device.

Accordingly, to compensate the change of the mobility and/or threshold voltage of the driving thin-film transistor Td, at least one sensing thin-film transistor and/or capacitor for sensing a voltage change can be further added in the pixel region P. The sensing thin-film transistor and/or capacitor can be connected to a reference line for applying a reference voltage and outputting a sensing voltage.

In the electroluminescent display device according to the embodiment of the present disclosure, the light-emitting diode De may include a first electrode, a light-emitting layer, and a second electrode. The first electrode, the light-emitting layer, and the second electrode can be sequentially formed over a substrate, and the switching thin-film transistor Ts, the driving thin-film transistor Td, and the storage capacitor Cst can be formed between the substrate and the first electrode. The electroluminescent display device according to the embodiment of the present disclosure can be a top-emission type, in which light from the light-emitting layer of the light-emitting diode De is output toward a direction opposite the substrate, that is, output to the outside through the second electrode. The top-emission type display device can have a wider emission area than a bottom-emission type display device of the same size, which may improve luminance and reduce power consumption.

To transmit light, the second electrode should be formed of a metal material to have a thin thickness or formed of a transparent conductive material. According to this, the resistance of the second electrode can increase, and a voltage drop can occur due to the resistance, thereby causing a problem of non-uniform brightness.

Therefore, in the present disclosure, the second electrode may be electrically connected to an auxiliary electrode to decrease the resistance of the second electrode. The second electrode can be electrically connected to the auxiliary electrode through a connection pattern, and an auxiliary pattern can be formed between the connection pattern and the second electrode, so that the electrical contact property can be improved by decreasing the contact resistance between the connection pattern and the second electrode.

Figure 2:
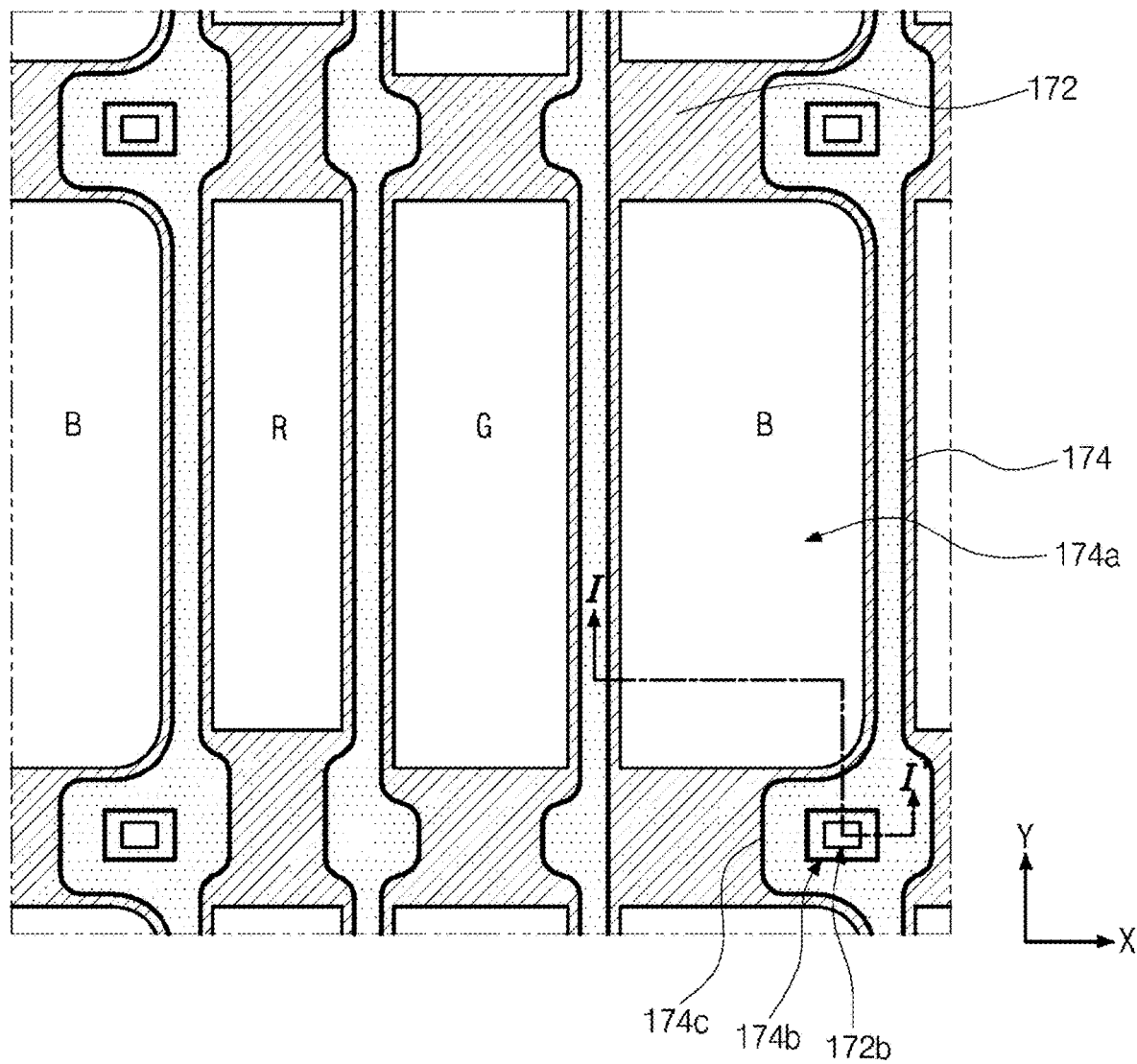
FIG. 2 is a schematic plan view of a pixel of an electroluminescent display device according to the embodiment of the present disclosure.

FIG. 2 is a schematic plan view of a pixel of an electroluminescent display device according to the embodiment of the present disclosure.

FIG. 2 primarily shows a bank configuration. In the example of FIG. 2, one pixel of the electroluminescent display device according to the embodiment of the present disclosure may include red, green, and blue sub-pixels R, G, and B. Each of the red, green, and blue sub-pixels R, G, and B can have the circuit configuration of the pixel region P of the example of FIG. 1.

The red, green, and blue sub-pixels R, G, and B may be sequentially arranged along a first direction (e.g., an X-axis direction), which may be a horizontal direction in the context of the figure. The same color sub-pixels R, G, and B may be arranged along a second direction (e.g., a Y-axis direction), which may be perpendicular to the first direction (e.g., the X-axis direction). The red, green, and blue sub-pixels R, G, and B are illustrated as each having a rectangular shape with substantially angled corners, but embodiments are not limited thereto. Each of the red, green, and blue sub-pixels R, G, and B can have various shapes, such as a rectangular shape with substantially rounded corners, an oval shape, or the like.

The red, green, and blue sub-pixels R, G, and B can have different sizes. The sizes of the red, green, and blue sub-pixels R, G, and B may be determined by considering the lifetime of a light-emitting diode provided at each sub-pixel. For example, the size of the green sub-pixel G can be larger than the size of the red sub-pixel R, and smaller than the size of the blue sub-pixel B. However, embodiments of the present disclosure are not limited thereto. For example, the red, green, and blue sub-pixels R, G, and B can have the same size.

The red, green, and blue sub-pixels R, G, and B can be defined by a bank. The bank may include a first bank 172 having a hydrophilic property and a second bank 174 having a hydrophobic property. For example, the first bank 172 may be disposed between adjacent same color sub-pixels R, G, and B, and between adjacent different color sub-pixels R, G, and B. The first bank 172 can surround each of the sub-pixels R, G, and B.

Alternatively, the first bank 172 can be omitted between the adjacent different color sub-pixels R, G, and B. That is, the first bank 172 can extend along the first direction (e.g., the X-axis direction), and can be formed only between the adjacent same color sub-pixels R, G, and B along the second direction (e.g., Y-axis direction).

The second bank 174 may be disposed on the first bank 172. The second bank 174 may have an opening 174a corresponding to a same color sub-pixel column, and may be disposed between adjacent different color sub-pixels R, G, and B along the first direction (e.g., the X-axis direction).

Accordingly, the opening 174a may extend in the second direction (e.g., the Y-axis direction), and the opening 174a may have a length of the second direction (e.g., the Y-axis direction) longer than a length of the first direction (e.g., the X-axis direction), for example, a width. The opening 174a may have a short side parallel to the first direction (e.g., the X-axis direction), and a long side parallel to the second direction (e.g., the Y-axis direction). The second bank 174 can have a narrower width than the first bank 172 between the adjacent different color sub-pixels R, G, and B along the first direction (e.g., the X-axis direction).

In addition, at least one side of the second bank 174 can have an extension part 174c extending in the first direction (e.g., the X-axis direction). In this case, the extension part 174c can be disposed between the adjacent same color sub-pixels R, G, and B along the second direction (e.g., the Y-axis direction), and can overlap the first bank 172. The extension part 174c may narrow a distance between portions of the second bank 174 along the first direction (e.g., the X-axis direction), so that a more uniform light-emitting layer can be formed by controlling the flow of a solution during a solution process for forming the light-emitting layer. The size of the extension part 174c can vary according to the size of each sub-pixel R, G, and B.

The first bank 172 and the second bank 174 may have first and second auxiliary contact holes 172b and 174b corresponding to at least one extension part 174c, respectively. Here, one extension part 174c and one of each of first and second auxiliary contact holes 172b and 174b can be formed to correspond to one pixel including the red, green, and blue sub-pixels R, G, and B. In this case, the first and second auxiliary contact holes 172b and 174b can be formed to be adjacent to the sub-pixel R, G, and B having the largest size. For example, the first and second auxiliary contact holes 172b and 174b can be formed to the extension part 174c disposed between the adjacent blue sub-pixels B along the second direction (e.g., the Y-axis direction). However, embodiments of the present disclosure are not limited thereto, and the number and location of the first and second auxiliary contact holes 172b and 174b can be varied.

Although not shown in the figure, an auxiliary electrode and a connection pattern may be formed to correspond to the extension part 174c where the first and second auxiliary contact holes 172b and 174b are formed, and the connection pattern may be exposed through the first and second auxiliary contact holes 172b and 174b. In addition, an auxiliary pattern may be formed between the connection pattern and the second electrode. Accordingly, the second electrode of the light-emitting diode may be electrically connected to the auxiliary electrode through the connection pattern, and it may be possible to decrease the contact resistance between the connection pattern and the second electrode due to the auxiliary pattern.

Example configurations of the electroluminescent display device according to the embodiment of the present disclosure will be described in detail with reference to the drawings.

First Embodiment

Figure 3:
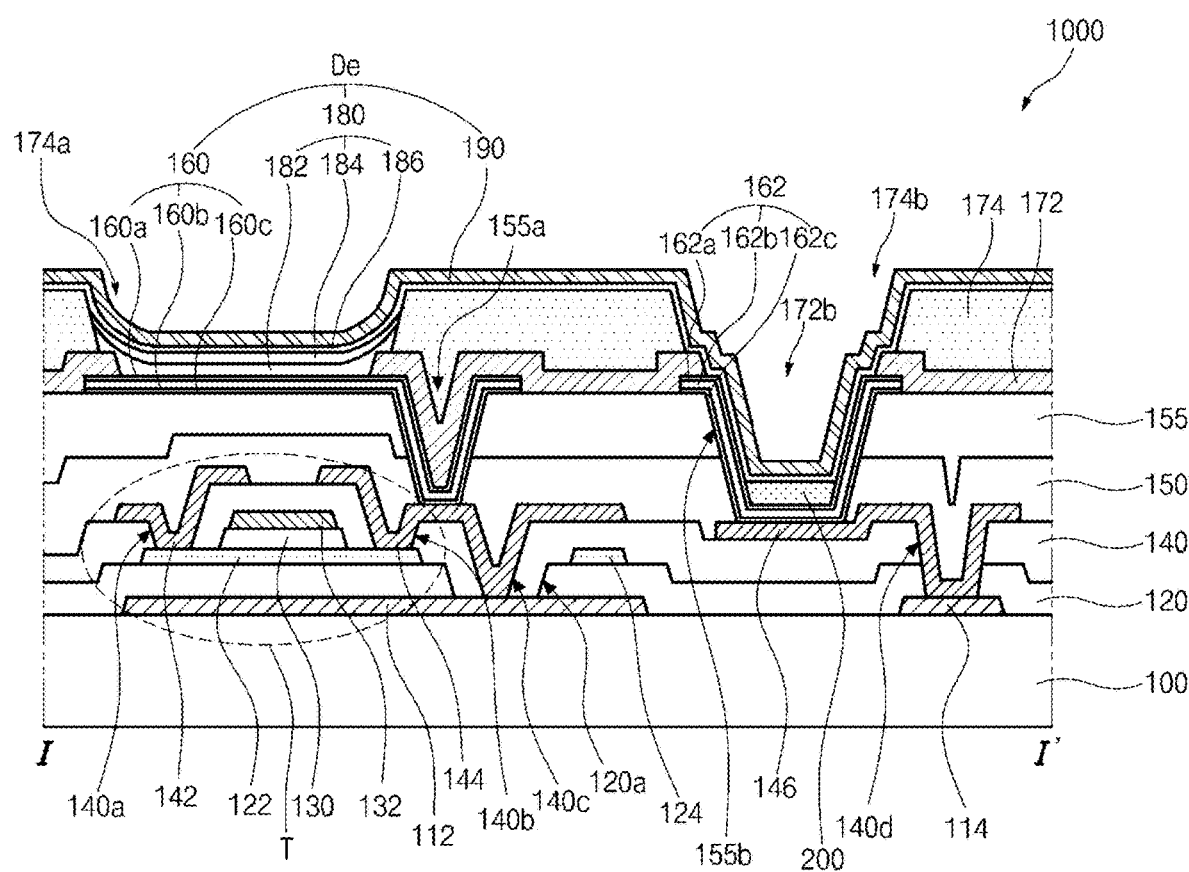
FIG. 3 is a schematic cross-sectional view of an electroluminescent display device according to a first embodiment of the present disclosure.

FIG. 3 is a schematic cross-sectional view of an electroluminescent display device according to a first embodiment of the present disclosure.

FIG. 3 shows a cross-section corresponding to line I-I' of FIG. 2. As shown in the example of FIG. 3, in the electroluminescent display device 1000 according to the first embodiment of the present disclosure, a light-blocking pattern 112 and a first auxiliary electrode 114 of a first conductive material, such as metal, may be formed on a substrate 100. The substrate 100 can be a glass substrate or a plastic substrate. For example, polyimide can be used for the plastic substrate, but embodiments are not limited thereto.

The light-blocking pattern 112 and the first auxiliary electrode 114 can be formed of one or more of: aluminum (Al), copper (Cu), molybdenum (Mo), titanium (Ti), chromium (Cr), nickel (Ni), tungsten (W), and an alloy thereof, and can have a single-layered structure or a multi-layered structure. For example, the light-blocking pattern 112 and the first auxiliary electrode 114 can have a double-layered structure including a lower layer of a molybdenum-titanium alloy (MoTi) and an upper layer of copper (Cu), and the upper layer can have be thicker than the lower layer.

The first auxiliary electrode 114 can extend in a first direction (e.g., the X-axis direction) and/or a second direction (e.g., the Y-axis direction) parallel to the substrate 100 in a plane. For example, the first auxiliary electrode 114 can extend in the first direction (e.g., the X-axis direction), and may correspond to a plurality of pixel regions arranged along the first direction (e.g., the X-axis direction). Otherwise, the first auxiliary electrode 114 can extend in the second direction (e.g., the Y-axis direction) crossing the first direction (e.g., the X-axis direction), and may correspond to a plurality of pixel regions arranged along the second direction (e.g., the Y-axis direction). Alternatively, the first auxiliary electrode 114 can extend in the first and second directions (X and Y-axis directions), and may have a lattice structure. However, embodiments of the present disclosure are not limited thereto.

A buffer layer 120 may be formed on the light-blocking pattern 112 and the first auxiliary electrode 114 substantially on an entire surface of the substrate 100. The buffer layer 120 can be formed of an inorganic insulating material, such as silicon oxide ($SiO_2$) or silicon nitride ($SiN_x$), and can be formed as a single layer or multiple layers.

The buffer layer 120 may have a buffer hole 120a on the light-blocking pattern 112. A top surface of the light-blocking pattern 112 may be partially exposed through the buffer hole 120a.

A semiconductor layer 122 and a capacitor electrode 124 may be patterned and formed on the buffer layer 120. The semiconductor layer 122 and the capacitor electrode 124 may be spaced apart from each other over the light-blocking pattern 112. The light-blocking pattern 112 may block light incident on the semiconductor layer 122, and reduce or prevent the semiconductor layer 122 from deteriorating due to the light.

The semiconductor layer 122 and the capacitor electrode 124 can be formed of polycrystalline silicon. In this case, the capacitor electrode 124 and both ends of the semiconductor layer 122 can be doped with impurities. Alternatively, the semiconductor layer 122 and the capacitor electrode 124 can be formed of an oxide semiconductor material.

A gate insulation layer 130 of an insulating material and a gate electrode 132 of a second conductive material may be sequentially formed on the semiconductor layer 122. The gate insulation layer 130 and the gate electrode 132 may be disposed to correspond to a center of the semiconductor layer 122.

The gate insulation layer 130 can be formed of an inorganic insulating material, such as silicon oxide ($SiO_2$) or silicon nitride ($SiN_x$). When the semiconductor layer 122 is made of an oxide semiconductor material, it may be preferable that the gate insulation layer 130 be formed of silicon oxide ($SiO_2$).

The gate electrode 132 can be formed of one or more of: aluminum (Al), copper (Cu), molybdenum (Mo), titanium (Ti), chromium (Cr), nickel (Ni), tungsten (W), and an alloy thereof, and can have a single-layered structure or a multi-layered structure. For example, the gate electrode 132 can have a double-layered structure, including a lower layer of a molybdenum-titanium alloy (MoTi) and an upper layer of copper (Cu), and the upper layer can be thicker than the lower layer.

As shown in the figure, the gate insulation layer 130 can be patterned to have the same shape as the gate electrode 132. A width of the gate insulation layer 130 can be greater than a width of the gate electrode 132. Thus, edges of a top surface of the gate insulation layer 130 can be exposed. Alternatively, the width of the gate insulation layer 130 can be the same as the width of the gate electrode 132. Otherwise, the gate insulation layer 130 may not be patterned and can be formed substantially over the entire surface of the substrate 100.

A gate line (not shown) can be further formed of the same material and on the same layer as the gate electrode 132. The gate line can extend in the first direction (e.g., the X-axis direction). When the first auxiliary electrode 114 extends in the first direction (e.g., the X-axis direction), the gate line and the first auxiliary electrode 114 can be parallel to each other.

An interlayer insulation layer 140, made of an insulating material, may be formed on the gate electrode 132 substantially over the entire surface of the substrate 100. The interlayer insulation layer 140 can be formed of an inorganic insulating material, such as silicon oxide ($SiO_2$) or silicon nitride ($SiN_x$). Alternatively, the interlayer insulation layer 140 can be formed of an organic insulating material, such as photoacryl or benzocyclobutene.

The interlayer insulation layer 140 may have first, second, third, and fourth contact holes 140a, 140b, 140c, and 140d. The first and second contact holes 140a and 140b may expose the both ends of the semiconductor layer 122. The third contact hole 140c may partially expose the top surface of the light-blocking pattern 112, and may be located in the buffer hole 120a. Alternatively, the buffer hole 120a may be omitted, and the third contact hole 140c can be formed in the buffer layer 120, as well as in the interlayer insulation layer 140, to partially expose the top surface of the light-blocking pattern 112. The fourth contact hole 140d may be formed in the buffer layer 120, as well as in the interlayer insulation layer 140, to partially expose a top surface of the first auxiliary electrode 114.

Source and drain electrodes 142 and 144 and a second auxiliary electrode 146, made of a third conductive material, such as metal, may be formed on the interlayer insulation layer 140. The source and drain electrodes 142 and 144 and the second auxiliary electrode 146 can be formed of one or more of: aluminum (Al), copper (Cu), molybdenum (Mo), titanium (Ti), chromium (Cr), nickel (Ni), tungsten (W), and an alloy thereof, and can have a single-layered structure or a multi-layered structure. For example, the source and drain electrodes 142 and 144 and the second auxiliary electrode 146 can have a double-layered structure, including a lower layer of a molybdenum-titanium alloy (MoTi) and an upper layer of copper (Cu), and the upper layer can be thicker than the lower layer. Alternatively, for example, the source and drain electrodes 142 and 144 and the second auxiliary electrode 146 can have a triple-layered structure.

The source and drain electrodes 142 and 144 may be spaced apart from each other substantially, with the gate electrode 132 positioned therebetween. The source and drain electrodes 142 and 144 may contact both ends of the semiconductor layer 122, through the first and second contact holes 140a and 140b, respectively. Further, the drain electrode 144 may contact the light-blocking pattern 112 through the third contact hole 140c, and may overlap the capacitor electrode 124. The capacitor electrode 124 may overlap the light-blocking pattern 112 and the drain electrode 144 to form a storage capacitor.

Meanwhile, the second auxiliary electrode 146 may overlap and contact the first auxiliary electrode 114 through the fourth contact hole 140d. The second auxiliary electrode 146 can extend in the second direction (e.g., the Y-axis direction), and may correspond to the plurality of pixel regions arranged along the second direction (e.g., the Y-axis direction). However, embodiments of the present disclosure are not limited thereto.

In addition, a data line (not shown) and a high voltage supply line (not shown) can be further formed on the interlayer insulation layer 140, and can be made of the third conductive material. The data line and the high voltage supply line can extend in the second direction (e.g., the Y-axis direction). Accordingly, the data line, the high voltage supply line, and the second auxiliary electrode 146 can be parallel to each other.

The semiconductor layer 122, the gate electrode 132, and the source and drain electrodes 142 and 144 may form a thin-film transistor T. The thin-film transistor T may have a coplanar structure in which the gate electrode 132 and the source and drain electrodes 142 and 144 may be located at the same side with respect to the semiconductor layer 122.

Alternatively, the thin-film transistor T can have an inverted staggered structure in which the gate electrode and the source and drain electrodes may be located at different sides with respect to the semiconductor layer. That is, the gate electrode can be disposed under the semiconductor layer, and the source and drain electrodes can be disposed over the semiconductor layer. In this case, the semiconductor layer can be formed of oxide semiconductor or amorphous silicon.

The thin-film transistor T may correspond to a driving thin-film transistor Td of FIG. 1, and a switching thin-film transistor Ts of FIG. 1 having the same structure as the driving thin-film transistor T can be further formed on the substrate 100. The gate electrode 132 of the driving thin-film transistor can be connected to a drain electrode of the switching thin-film transistor, and the source electrode 142 of the driving thin-film transistor may be connected to the power supply line. In addition, a gate electrode and a source electrode of the switching thin-film transistor can be connected to the gate line and the data line, respectively.

A passivation layer 150 of an insulating material may be formed on the source and drain electrodes 142 and 144 and the second auxiliary electrode 146, substantially over the entire surface of the substrate 100. The passivation layer 150 can be formed of an inorganic insulating material, such as silicon oxide ($SiO_2$) or silicon nitride ($SiN_x$).

Next, an overcoat layer 155 of an insulating material may be formed on the passivation layer 150, substantially over the entire surface of the substrate 100. The overcoat layer 155 can be formed of an organic insulating material such as photoacryl or benzocyclobutene. The overcoat layer 155 can eliminate level differences due to lower layers, and may have a substantially flat top surface.

One of the passivation layer 150 and the overcoat layer 155 can be omitted. For example, the passivation layer 150 can be omitted, but embodiments are not limited thereto.

The passivation layer 150 and the overcoat layer 155 may have a drain contact hole 155a exposing the drain electrode 144. Further, the passivation layer 150 and the overcoat layer 155 may have a fifth contact hole 155b exposing the second auxiliary electrode 146.

A first electrode 160 having a relatively high work function may be formed on the overcoat layer 155. The first electrode 160 may be in contact with the drain electrode 144 through the drain contact hole 155a.

The first electrode 160 may include a first layer 160a and a second layer 160b, and the second layer 160b may be disposed between the first layer 160a and the substrate 100, for example, between the first layer 160a and the overcoat layer 155.

The first layer 160a may be formed of a conductive material having a relatively high work function. For example, the first layer 160a can be formed of a transparent conductive material, such as indium tin oxide (ITO) or indium zinc oxide (IZO). The second layer 160b may be formed of a metal material having relatively high reflectance. For example, the second layer 160b can be formed of silver (Ag), but embodiments are not limited thereto. The work function of the first layer 160a may be higher than the work function of the second layer 160b.

A thickness of the second layer 160b can be greater than a thickness of the first layer 160a. For example, the thickness of the second layer 160b can be 80 nm to 100 nm, and the thickness of the first layer 160a can be 10 nm to 80 nm. However, embodiments of the present disclosure are not limited thereto.

In addition, the first electrode 160 can further include a third layer 160c between the second layer 160b and the overcoat layer 155. The third layer 160c may be formed to improve the adhesion property between the second layer 160b and the overcoat layer 155, and the third layer 160c can be omitted. For example, the third layer 160c can be formed of a transparent conductive material, such as ITO or IZO, but embodiments are not limited thereto.

A thickness of the third layer 160c can be smaller than the thickness of the first layer 160a, and can be smaller than or equal to the thickness of the second layer 160b. For example, the thickness of the third layer 160c can be 10 nm, but embodiments are not limited thereto.

In addition, a connection pattern 162 may be formed on the overcoat layer 155, and may be formed of the same material as the first electrode 160. Accordingly, the connection pattern 162 can include first, second, and third layers 162a, 162b, and 162c. The second layer 162b may be disposed between the first layer 162a and the third layer 162c, and the third layer 162c may be disposed between the second layer 162b and the substrate 100, for example, between the second layer 162b and the overcoat layer 155. The connection pattern 162 may be in contact with the second auxiliary electrode 146 through the fifth contact hole 155b.

As described above, when the third layer 160c of the first electrode 160 is omitted and the first electrode 160 is configured as having two layers, the third layer 162c of the connection pattern 162 may also be omitted and the connection pattern 162 may have a double-layered structure. A bank of an insulating material may be formed on the first electrode 160. The bank may include a first bank 172 having a hydrophilic property and a second bank 174 having a hydrophobic property.

For example, the first bank 172 may overlap and cover edges of the first electrode 160, and may expose a central portion of the first electrode 160. The first bank 172 may be in contact with the edges of the first electrode 160. The first bank 172 may also be formed on the connection pattern 162, and may overlap and cover edges of the connection pattern 162. The first bank 172 may have a first auxiliary contact hole 172b exposing a central portion of the connection pattern 162.

The first bank 172 can be formed of a material having a hydrophilic property, for example, an inorganic insulating material, such as silicon oxide ($SiO_2$) or silicon nitride ($SiN_x$). Alternatively, the first bank 172 can be formed of polyimide.

The second bank 174 may be formed on the first bank 172. At least a top surface of the second bank 174 may be hydrophobic, and a side surface of the second bank 174 can be hydrophobic or hydrophilic.

The second bank 174 may have an opening 174a exposing the central portion of the first electrode 160. As described above, the second bank 174 can be formed between adjacent different color sub-pixels, and the opening 174a of the second bank 174 can be formed to correspond to the same color sub-pixel column.

The second bank 174 may be disposed on the first bank 172 with a narrower width than the first bank 172, and may expose edges of the first bank 172. In addition, a thickness of the second bank 174 can be greater than a thickness of the first bank 172.

As described above, the first bank 172 can be omitted between the adjacent same different sub-pixels. In this case, the second bank 174 can be in contact with the edges of the first electrode 160.

The second bank 174 can be formed of an organic insulating material having a hydrophobic property. Alternatively, the second bank 174 can be formed of an organic insulating material having a hydrophilic property and subjected to a hydrophobic treatment.

Further, the second bank 174 may have a second auxiliary contact hole 174b corresponding to the first auxiliary contact hole 172b. The connection pattern 162 may be exposed through the first and second auxiliary contact holes 172b and 174b.

In one embodiment, only the first bank 172 may be disposed on other edges of the first electrode 160 not shown in the figure. In addition, the first bank 172 and the second bank 174 may be formed of different materials, and may be separated from each other in FIG. 3. However, the hydrophilic first bank 172 and the hydrophobic second bank 174 can be formed of the same material, and may be formed as one body. For example, an organic material layer having a hydrophobic top surface can be formed substantially over the entire surface of the substrate 100, can be exposed to light through a halftone mask including a light-transmitting portion, a light-blocking portion and a half light-transmitting portion, and can be patterned, thereby forming the hydrophilic first bank 172 and the hydrophobic second bank 174 having different widths and different thicknesses.

A light-emitting layer 180 may be formed on the first electrode 160 exposed by the first and second banks 172 and 174. The light-emitting layer 180 can include a first charge auxiliary layer 182, a light-emitting material layer 184, and a second charge auxiliary layer 186, that may be sequentially positioned over the first electrode 160. The light-emitting material layer 184 can be formed of any one of red, green, and blue luminescent materials, but embodiments are not limited thereto. The luminescent material can be an organic luminescent material, such as a phosphorescent compound or a fluorescent compound, or can be an inorganic luminescent material, such as a quantum dot.

The first charge auxiliary layer 182 can be a hole auxiliary layer, and the hole auxiliary layer can include at least one of a hole injecting layer (HIL) and a hole transporting layer (HTL). In addition, the second charge auxiliary layer 186 can be an electron auxiliary layer, and the electron auxiliary layer can include at least one of an electron injecting layer (EIL) and an electron transporting layer (ETL). However, embodiments of the present disclosure are not limited thereto.

Here, each of the first charge auxiliary layer 182 and the light-emitting material layer 184 can be formed through a solution process. Thus, the process can be simplified, and a display device with a large size and high resolution can be provided. A spin coating method, an ink jet printing method, or a screen printing method can be used as the solution process, but embodiments of the present disclosure are not limited thereto.

As described above, because the opening 174a of the second bank 174 may be formed to correspond to the same color sub-pixel column, solutions dropped into respective pixel regions corresponding to the same color sub-pixel column through different nozzles may be connected to each other, and each of the first charge auxiliary layer 182 and the light-emitting material layer 184 may be formed by drying the solutions. Thus, the first charge auxiliary layers 182 or the light-emitting material layers 184 in adjacent pixel regions corresponding to the same color sub-pixel column may be connected to each other and formed as one body. Accordingly, the deviation between the dropping amounts of the nozzles can be reduced or minimized, and the thicknesses of the thin-films formed in the respective pixel regions can be uniform.

When the solution is dried, a drying speed of a solvent in a region adjacent to the second bank 174 may be different from that in other regions. That is, the drying speed of the solvent in the region adjacent to the second bank 174 may be faster than that in the other regions. Therefore, a height of each of the first charge auxiliary layer 182 and the light-emitting material layer 184 in the region adjacent to the second bank 174 can rise as it gets closer to the second bank 174.

On the other hand, the second charge auxiliary layer 186 can be formed through a thermal evaporation process. Accordingly, the second charge auxiliary layer 186 can be formed substantially over the entire surface of the substrate 100. That is, the second charge auxiliary layer 186 can be formed on the top surface and the side surface of the second bank 174, and can also be formed on the connection pattern 162.

An auxiliary pattern 200 may be formed between the connection pattern 162 and the second charge auxiliary layer 186. The auxiliary pattern 200 can have a width and size smaller than the connection pattern 162, and can be spaced apart from the first and second banks 172 and 174. The auxiliary pattern 200 can be disposed in the fifth contact hole 155b.

The auxiliary pattern 200 can have a thickness of 100 nm to 300 nm, but embodiments are not limited thereto. The auxiliary pattern 200 can be formed of a metal or a metal oxide, and can be formed through a deposition process or a solution process. This will be described in detail later.

A second electrode 190 of a conductive material, having relatively low work function, may beformed on the light-emitting layer 180, for example, on the second charge auxiliary layer 186, substantially over the entire surface of the substrate 100. The second electrode 190 can be formed of one or more of: aluminum (Al), magnesium (Mg), silver (Ag), and an alloy thereof. The second electrode 190 may be relatively thin, such that light from the light-emitting layer 180 can be transmitted therethrough. For example, the second electrode 190 can have the thickness of 5 nm to 10 nm, but embodiments are not limited thereto. Alternatively, the second electrode 190 can be formed of a transparent conductive material, such as indium-gallium-oxide (IGO) or IZO.

The second electrode 190 may be electrically connected to the connection pattern 162 through the first and second auxiliary contact holes 172b and 174b. Accordingly, the second electrode 190 may be electrically connected to the first and second auxiliary electrodes 114 and 146 through the connection pattern 162. The second charge auxiliary layer 186 may be disposed between the connection pattern 162 and the second electrode 190. Because the second charge auxiliary layer 186 may have an insulating property, and may act as a resistor, a contact property between the second electrode 190 and the connection pattern 162 may be lowered. In addition, resistances acting on the first and second auxiliary contact holes 172b and 174b of respective pixel regions may not be the same, thereby causing an emission difference between the pixel regions.

However, the auxiliary pattern 200 according to an embodiment may be formed between the second electrode 190 and the connection pattern 162, for example, between the second charge auxiliary layer 186 and the connection pattern 162. Thus, the contact property between the second electrode 190 and the connection pattern 162 can increase, and the emission of each pixel region can be uniform.

As described above, the auxiliary pattern 200 can be formed of a metal or a metal oxide. For example, the auxiliary pattern 200 can be formed of a metal having a lower electrical resistivity than the first layer 162a of the connection pattern 162. For example, the auxiliary pattern 200 may be formed of aluminum (Al) or silver (Ag), but embodiments are not limited thereto. Alternatively, the auxiliary pattern 200 can be formed of a metal oxide, such as zinc oxide (ZnO) or molybdenum trioxide ($MoO_3$), for example.

Because the energy level difference between the connection pattern 162 and the second charge auxiliary layer 186 may be relatively large, the electron injection characteristics may be lowered therebetween. In the present disclosure, a lowest unoccupied molecular orbital (LUMO) level capable of injecting an electron may be generated between the connection pattern 162 and the second charge auxiliary layer 186, for example, between the first layer 162a of the connection pattern 162 and the second charge auxiliary layer 186, by forming the auxiliary pattern 200 of zinc oxide. Thus, it may be possible to effectively inject an electron from the connection pattern 162 to the second charge auxiliary layer 186. That is, the LUMO level of zinc oxide may be between the Fermi level of the first layer 162a of the connection pattern 162 and the LUMO level of the second charge auxiliary layer 186. Thus the electron injection can be facilitated from the first layer 162a of the connection pattern 162 to the second charge auxiliary layer 186.

By forming the auxiliary pattern 200 of molybdenum trioxide ($MoO_3$), it may be possible to enable the effective electron injection into the second charge auxiliary layer 186 using the charge generation between the first layer 162a of the connection pattern 162 and the second charge auxiliary layer 186. For example, the molybdenum trioxide ($MoO_3$) may separate holes and electrons by the Fermi level adjustment between the first layer 162a of the connection pattern 162 and the second charge auxiliary layer 186, and may transfer the holes into the first layer 162a of the connection pattern 162 and the electrons into the second charge auxiliary layer 186, so that the electron injection into the second charge auxiliary layer 186 can be facilitated.

The auxiliary pattern 200 of the metal oxide can be formed through a deposition process or a solution process. When the auxiliary pattern 200 is formed through the solution process, the manufacturing time and costs can be decreased because an additional patterning process can be omitted.

The zinc oxide can have the form of nanowires. The auxiliary pattern 200 of the zinc oxide having the form of nanowires can be formed through the solution process.

The first electrode 160, the light-emitting layer 180, and the second electrode 190 may constitute a light-emitting diode De. The first electrode 160 can serve as an anode, and the second electrode 190 can serve as a cathode, but embodiments are not limited thereto.

As described above, the electroluminescent display device 1000 according to the first embodiment of the present disclosure can be a top-emission type in which light from the light-emitting layer 180 of the light-emitting diode De may be output toward a direction opposite the substrate 100, that is, output to the outside through the second electrode 190. The top-emission type display device can have a wider emission area than a bottom-emission type display device of the same size, to thereby improve luminance and reduce power consumption. The light-emitting diode De of each pixel region can have an element thickness for a microcavity effect corresponding to a wavelength of the emitted light, thereby increasing the light efficiency.

Although not shown in the figure, a capping layer can be formed on the second electrode 190 substantially over the entire surface of the substrate 100. The capping layer can be formed of an insulating material having a relatively high refractive index. The wavelength of light traveling along the capping layer can be amplified by surface plasma resonance. Thus, the intensity of the peak can be increased, thereby improving the light efficiency in the top-emission type electroluminescent display device. For example, the capping layer can be formed as a single layer of an organic layer or an inorganic layer, or may be formed as organic/inorganic stacked layers.

As described above, in the electroluminescent display device 1000 according to the first embodiment of the present disclosure, by forming some of the light-emitting layer 180 through the solution process, a mask may be omitted. Thereby the manufacturing costs may be reduced, and a display device with a large size and high definition can be implemented.

In addition, the electroluminescent display device 1000 according to the first embodiment of the present disclosure can be configured as the top-emission type, thereby improving luminance and reducing power consumption. The second electrode 190 may be relatively thin or may be formed of a transparent conductive material to transmit light, and its resistance may increase. However, the second electrode 190 may be connected to the first and second auxiliary electrodes 114 and 146 through the connection pattern 162, so that the resistance of the second electrode 190 can be decreased.

The auxiliary pattern 200 of the metal or the metal oxide may be formed between the second electrode 190 and the connection pattern 162, and for example, between the second charge auxiliary layer 186 and the connection pattern 162, so that the contact properties between the second electrode 190 and the connection pattern 162 can be improved. One of the first and second auxiliary electrodes 114 and 146 can be omitted.

Second Embodiment

Figure 4:
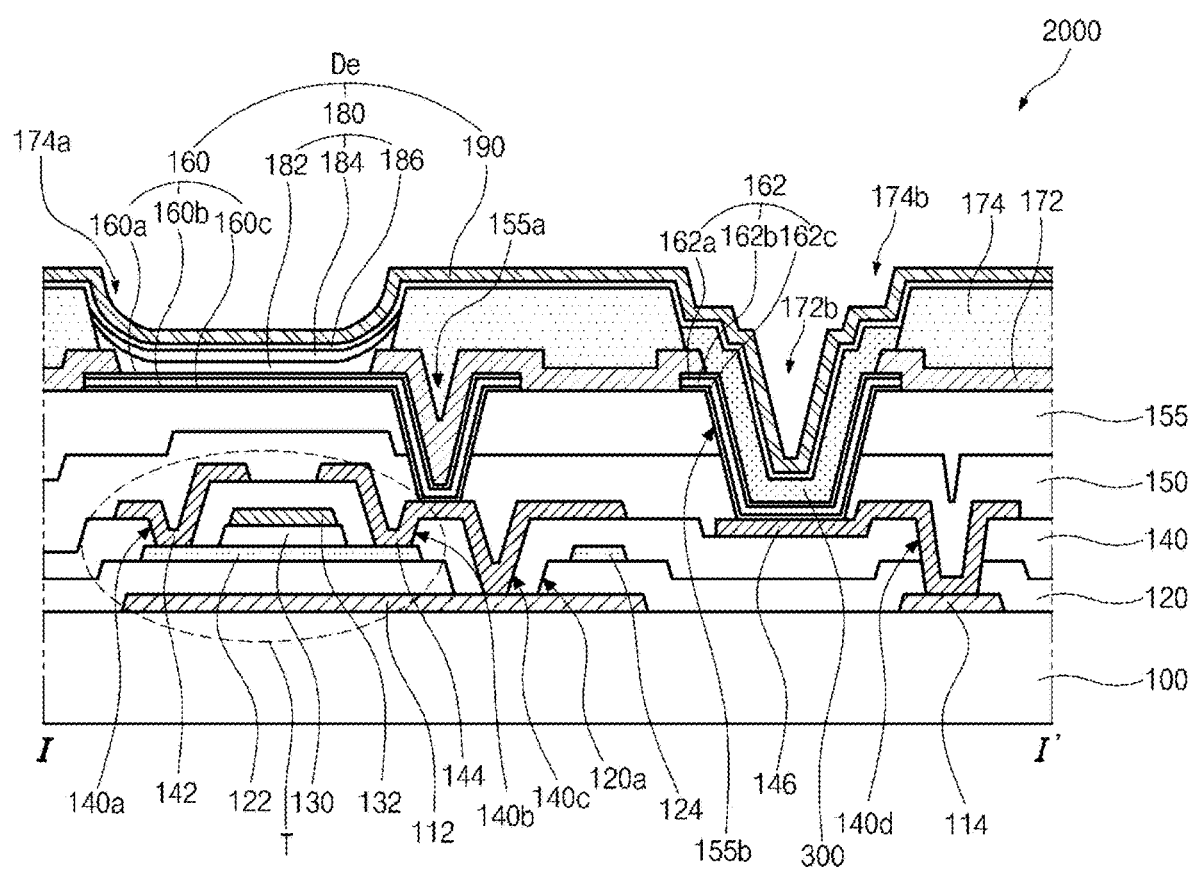
FIG. 4 is a schematic cross-sectional view of an electroluminescent display device according to a second embodiment of the present disclosure.

FIG. 4 is a schematic cross-sectional view of an electroluminescent display device according to a second embodiment of the present disclosure.

FIG. 4 shows a cross-section corresponding to the line I-I' of FIG. 2. The electroluminescent display device according to the second embodiment of the present disclosure has substantially the same configuration as that of the first embodiment, except for the auxiliary pattern. The same parts as that of the first embodiment are designated by the same reference signs, and explanation for the same parts will be shortened or omitted.

As shown in the example FIG. 4, in the electroluminescent display device 2000 according to the second embodiment of the present disclosure, the first electrode 160, the light-emitting layer 180, and the second electrode 190 may be sequentially formed over the substrate 100 to thereby form the light-emitting diode De. Light from the light-emitting layer 180 of the light-emitting diode De may be output to the outside through the second electrode 190.

To do this, the second electrode 190 can be formed of a metal material, such as aluminum (Al), magnesium (Mg), silver (Ag), or their alloys, and can be relatively thin. For example, the second electrode 190 can have a thickness of 5 nm to 10 nm, but embodiments are not limited thereto. Alternatively, the second electrode 190 can be formed of a transparent conductive material, such as IGO or IZO.

The second electrode 190 may be electrically connected to the connection pattern 162 through the first and second auxiliary contact holes 172b and 174b. Accordingly, the second electrode 190 may be electrically connected to the first and second auxiliary electrodes 114 and 146 through the connection pattern 162.

The second charge auxiliary layer 186 may be disposed between the second electrode 190 and the connection pattern 162. Because the second charge auxiliary layer 186 may have an insulating property, the contact property between the second electrode 190 and the connection pattern 162 may be lowered. Accordingly, to improve the contact property between the second electrode 190 and the connection pattern 162, the auxiliary pattern 300 may be formed between the second electrode 190 and the connection pattern 162, and for example, between the second charge auxiliary layer 186 and the connection pattern 162.

The auxiliary pattern 300 may be in contact with the first and second banks 172 and 174. The auxiliary pattern 300 can have a width corresponding to the connection pattern 162. For example, the auxiliary pattern 300 can be in contact with side and top surfaces of the first bank 172, and may be in contact with a side surface of the second bank 174. In this case, the width of the auxiliary pattern 300 can be greater than or equal to the width of the connection pattern 162.

Alternatively, the auxiliary pattern 300 can be in contact with the first bank 172 and spaced apart from the second bank 174. In this case, the auxiliary pattern 300 can be in contact with only the side surface of the first bank 172, and the width of the auxiliary pattern 300 can be smaller than the width of the connection pattern 162. The thickness of the auxiliary pattern 300 can be 100 nm to 300 nm, but embodiments are not limited thereto.

The auxiliary pattern 300 can be formed of a metal having a lower electrical resistivity than the first layer 162a of the connection pattern 162. For example, the auxiliary pattern 300 may be formed of aluminum (Al) or silver (Ag), but embodiments are not limited thereto.

Alternatively, the auxiliary pattern 300 can be formed of a metal oxide. The auxiliary pattern 300 of the metal oxide may facilitate the electron injection from the first layer 162a of the connection pattern 162 to the second charge auxiliary layer 186. For example, the auxiliary pattern 300 can be formed of zinc oxide (ZnO) or molybdenum trioxide ($MoO_3$).

The auxiliary pattern 300 of the metal oxide can be formed through the deposition process or the solution process. The zinc oxide can have the form of nanowires.

As described above, the electroluminescent display device 2000, according to the second embodiment of the present disclosure, can be configured as the top-emission type, thereby improving luminance and reducing power consumption. The second electrode 190 may be connected to the first and second auxiliary electrodes 114 and 146 through the connection pattern 162, so that the resistance of the second electrode 190 can be decreased.

The auxiliary pattern 300 of the metal or the metal oxide may be formed between the second electrode 190 and the connection pattern 162, and for example, between the second charge auxiliary layer 186 and the connection pattern 162. As such, the contact properties between the second electrode 190 and the connection pattern 162 can be improved.

In addition, the auxiliary pattern 300 may have a relatively large area, such that the auxiliary pattern 300 can be in contact with the first and second banks 172 and 174, thereby increasing the contact area compared with the first embodiment. Accordingly, the contact resistance between the second electrode 190 and the connection pattern 162 can be further decreased.

Third Embodiment

Figure 5:
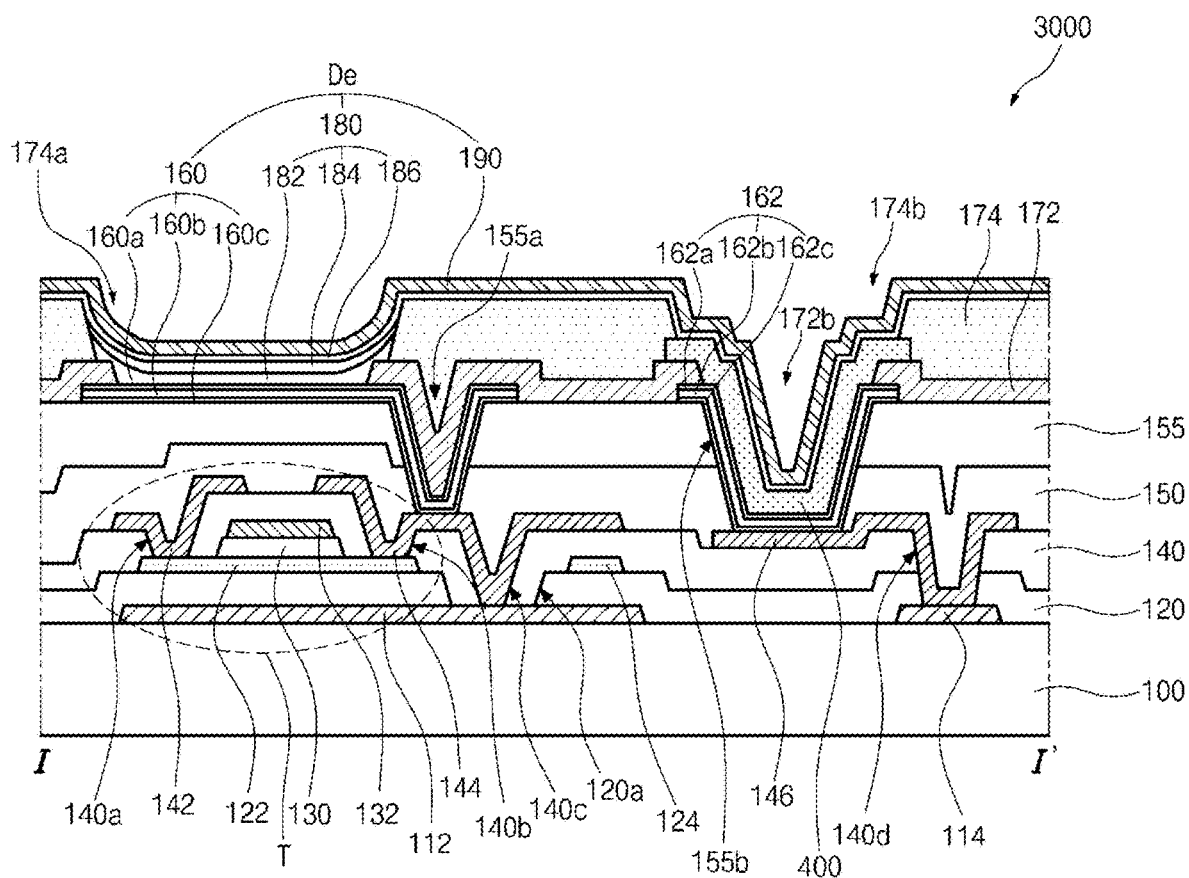
FIG. 5 is a schematic cross-sectional view of an electroluminescent display device according to a third embodiment of the present disclosure.

FIG. 5 is a schematic cross-sectional view of an electroluminescent display device according to a third embodiment of the present disclosure.

FIG. 5 shows a cross-section corresponding to the line I-I' of FIG. 2. The electroluminescent display device according to the third embodiment of the present disclosure has substantially the same configuration as that of the first embodiment, except for the auxiliary pattern. The same parts as that of the first embodiment are designated by the same reference signs, and explanation for the same parts will be shortened or omitted.

As shown in the example of FIG. 5, in the electroluminescent display device 3000 according to the third embodiment of the present disclosure, the first electrode 160, the light-emitting layer 180, and the second electrode 190 may be sequentially formed over the substrate 100 to thereby form the light-emitting diode De. Light from the light-emitting layer 180 of the light-emitting diode De may be output to the outside through the second electrode 190.

To do this, the second electrode 190 can be formed of a metal material, such as aluminum (Al), magnesium (Mg), silver (Ag), or their alloys, and be relatively thin. For example, the second electrode 190 can have a thickness of 5 nm to 10 nm, but embodiments are not limited thereto. Alternatively, the second electrode 190 can be formed of a transparent conductive material, such as IGO or IZO.

The second electrode 190 may be electrically connected to the connection pattern 162 through the first and second auxiliary contact holes 172b and 174b. Accordingly, the second electrode 190 may be electrically connected to the first and second auxiliary electrodes 114 and 146 through the connection pattern 162.

The second charge auxiliary layer 186 may be disposed between the second electrode 190 and the connection pattern 162. Because the second charge auxiliary layer 186 may have an insulating property, the contact property between the second electrode 190 and the connection pattern 162 may be lowered. Accordingly, to improve the contact property between the second electrode 190 and the connection pattern 162, the auxiliary pattern 400 may be formed between the second electrode 190 and the connection pattern 162, and for example, between the second charge auxiliary layer 186 and the connection pattern 162.

The auxiliary pattern 400 may be in contact with the first and second banks 172 and 174. The auxiliary pattern 400 can have a width corresponding to the connection pattern 162. For example, the auxiliary pattern 400 can be formed between the first bank 172 and the second bank 174, so that the auxiliary pattern 400 can be in contact with side and top surfaces of the first bank 172 and be in contact with a bottom surface of the second bank 174. In this case, the width of the auxiliary pattern 400 can be greater than or equal to the width of the connection pattern 162. The thickness of the auxiliary pattern 400 can be 100 nm to 300 nm, but embodiments are not limited thereto.

The auxiliary pattern 400 can be formed of a metal having a lower electrical resistivity than the first layer 162a of the connection pattern 162. For example, the auxiliary pattern 400 may be formed of aluminum (Al) or silver (Ag), but embodiments are not limited thereto.

Alternatively, the auxiliary pattern 400 can be formed of a metal oxide. The auxiliary pattern 400 of the metal oxide may facilitate the electron injection from the first layer 162a of the connection pattern 162 to the second charge auxiliary layer 186. For example, the auxiliary pattern 400 can be formed of zinc oxide (ZnO) or molybdenum trioxide ($MoO_3$).

The auxiliary pattern 400 of the metal oxide can be formed through the deposition process or the solution process. The zinc oxide can have the form of nanowires.

As described above, the electroluminescent display device 3000, according to the third embodiment of the present disclosure, can be configured as the top-emission type, thereby improving luminance and reducing power consumption. The second electrode 190 may be connected to the first and second auxiliary electrodes 114 and 146 through the connection pattern 162, so that the resistance of the second electrode 190 can be decreased.

The auxiliary pattern 400 of the metal or the metal oxide may be formed between the second electrode 190 and the connection pattern 162, and for example, between the second charge auxiliary layer 186 and the connection pattern 162. As such, the contact properties between the second electrode 190 and the connection pattern 162 can be improved.

In addition, the auxiliary pattern 400 may have a relatively large area, such that the auxiliary pattern 400 can be in contact with the first and second banks 172 and 174, thereby increasing the contact area compared with the first embodiment. Accordingly, the contact resistance between the second electrode 190 and the connection pattern 162 can be further decreased.

As described above, the second layers 160b and 162b of the first electrode 160 and the connection pattern 162 can be formed of silver (Ag). Silver films may show hillock growth at high temperatures. For example, the hillock growth may be generated in the second layer 162b of the connection pattern 162 due to the high resistance between the second electrode 190 and the connection pattern 162. The hillock growth may break through the first layer 162a of the connection pattern 162 and the second charge auxiliary layer 186, and may be in direct contact with the second electrode 190, thereby causing a current concentration phenomenon. Accordingly, a white flickering or burning phenomenon may occur at the contact portion of the hillock growth and the second electrode 190.

Configurations that can solve the current concentration phenomenon due to the hillock growth will be presented in the following embodiments.

Fourth Embodiment

Figure 6:
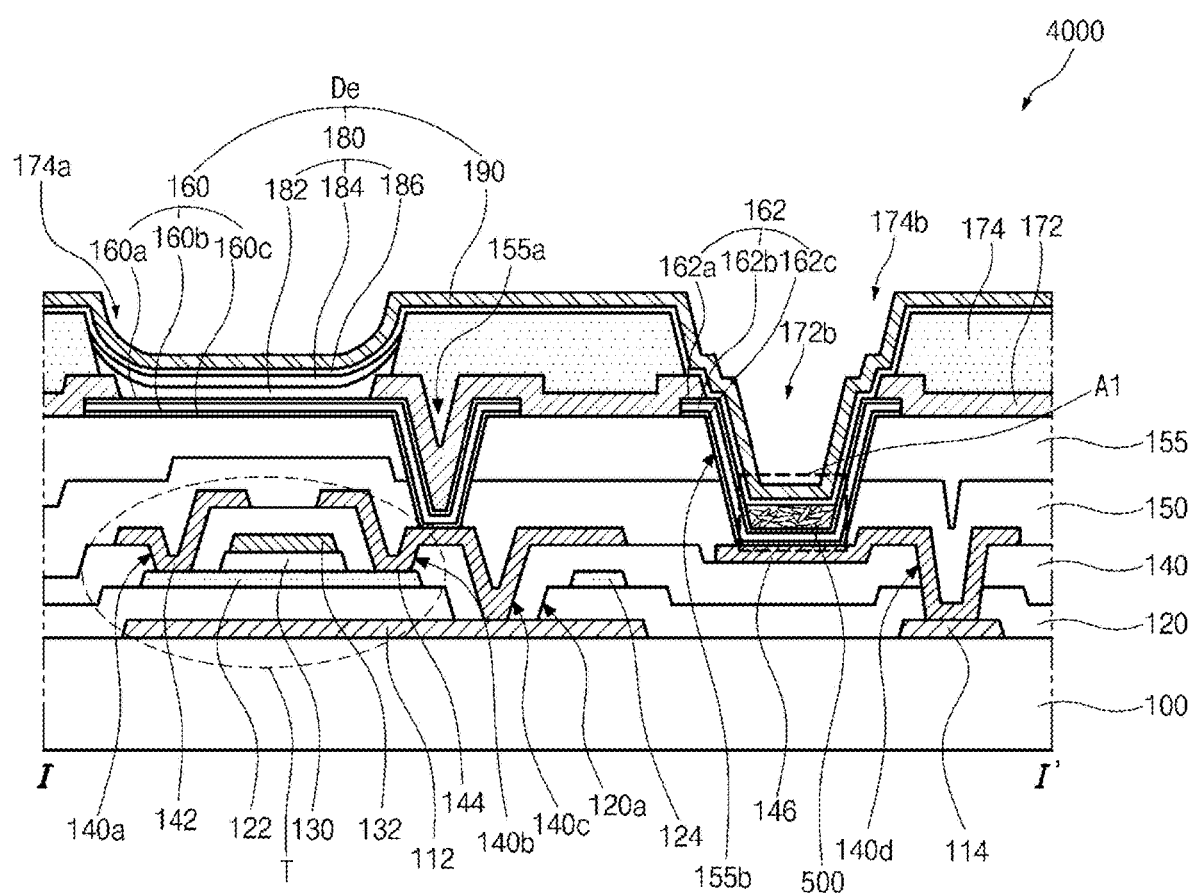
FIG. 6 is a schematic cross-sectional view of an electroluminescent display device according to a fourth embodiment of the present disclosure.
Figure 7:
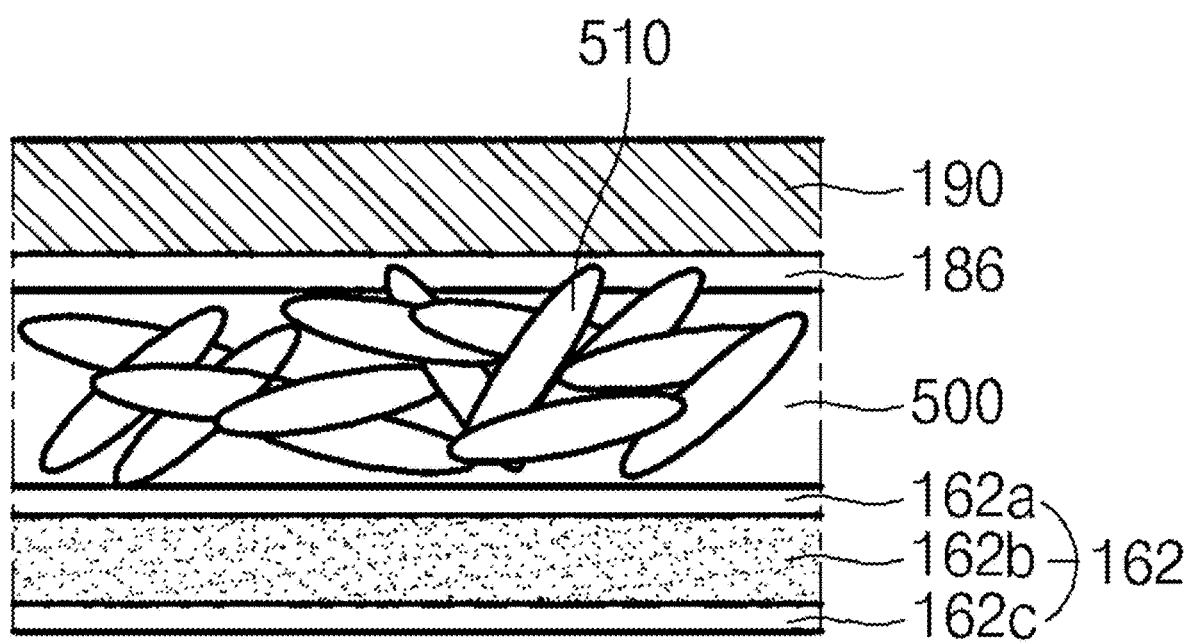
FIG. 7 is a schematic cross-sectional view enlarging the area A1 of FIG. 6.

FIG. 6 is a schematic cross-sectional view of an electroluminescent display device according to a fourth embodiment of the present disclosure. FIG. 7 is a schematic cross-sectional view enlarging the area A1 of FIG. 6.

The electroluminescent display device according to the fourth embodiment of the present disclosure has substantially the same configuration as that of the first embodiment, except for the auxiliary pattern. The same parts as that of the first embodiment are designated by the same reference signs, and explanation for the same parts will be shortened or omitted.

FIG. 6 shows a cross-section corresponding to the line I-I' of FIG. 2. As shown in the examples of FIG. 6 and FIG. 7, in the electroluminescent display device 4000, according to the fourth embodiment of the present disclosure, the first electrode 160, the light-emitting layer 180, and the second electrode 190 may be sequentially formed over the substrate 100 to thereby form the light-emitting diode De. Light from the light-emitting layer 180 of the light-emitting diode De may be output to the outside through the second electrode 190.

To do this, the second electrode 190 can be formed of a metal material, such as aluminum (Al), magnesium (Mg), silver (Ag), or their alloys, and can be relatively thin. For example, the second electrode 190 can have a thickness of 5 nm to 10 nm, but embodiments are not limited thereto. Alternatively, the second electrode 190 can be formed of a transparent conductive material, such as IGO or IZO.

The second electrode 190 may be electrically connected to the connection pattern 162 through the first and second auxiliary contact holes 172b and 174b. Accordingly, the second electrode 190 may be electrically connected to the first and second auxiliary electrodes 114 and 146 through the connection pattern 162.

The second charge auxiliary layer 186 may be disposed between the second electrode 190 and the connection pattern 162. Because the second charge auxiliary layer 186 may have an insulating property, the contact property between the second electrode 190 and the connection pattern 162 may be lowered. Accordingly, to improve the contact property between the second electrode 190 and the connection pattern 162, the auxiliary pattern 500 may be formed between the second electrode 190 and the connection pattern 162, and for example, between the second charge auxiliary layer 186 and the connection pattern 162.

The auxiliary pattern 500 may have a width and size smaller than the connection pattern 162, and may be spaced apart from the first and second banks 172 and 174. In this case, the auxiliary pattern 500 may be disposed in the fifth contact hole 155b.

Alternatively, the auxiliary pattern 500, as in the second or third embodiment, may be in contact with the first and second banks 172 and 174. The auxiliary pattern 500 can have a width corresponding to the connection pattern 162.

The thickness of the auxiliary pattern 500 can be 100 nm to 300 nm, but embodiments are not limited thereto.

The auxiliary pattern 300 can be formed of conductive nanoparticles 510. The conductive nanoparticles 510 may have a lower electrical resistivity than the first layer 162a of the connection pattern 162. The conductive nanoparticles 510 may include metal nanorods, metal nanowires, metal nanodots, and carbon nanotubes. For example, the auxiliary pattern 500 may be formed of gold (Au) nanorods, silver (Ag) nanowires, silver (Ag) nanodots, or carbon nanotubes (CNTs), but embodiments are not limited thereto. Alternatively, the auxiliary pattern 500 may be formed of zinc oxide (ZnO) nanowires. Embodiments are not limited to these examples.

An unevenness may be formed at the top surface of the auxiliary pattern 500, formed of the conductive nanoparticles 510. The top surface of the auxiliary pattern 500 may have a higher surface roughness than the top surface of the first layer 162a of the connection pattern 162. The surface roughness can be determined as the roughness peak-to-valley Rpv, which is the height difference between the highest and lowest points measured by an atomic force microscope (AFM). The Rpv of the top surface of the auxiliary pattern 500 may be higher than the Rpv of the top surface of the first layer 162a of the connection pattern 162. For example, the Rpv of the top surface of the auxiliary pattern 500 may be 200 nm to 300 nm, and the Rpv of the top surface of the first layer 162a of the connection pattern 162, but embodiments are not limited thereto.

The auxiliary pattern 500, formed of the conductive nanoparticles 510, can be formed by printing the conductive nanoparticles 510 on the connection pattern 162, and performing a separate heat treatment process. The conductive nanoparticles 510 may be bonded to each other through the heat treatment process and aggregated to form a network structure, so that the top surface of the auxiliary pattern 500 may have the surface roughness.

Alternatively, the auxiliary pattern 500, formed of the conductive nanoparticles 510, can be formed by printing the conductive nanoparticles 510 on the connection pattern 162, and forming the light-emitting layer 180 through the solution process so that the conductive nanoparticles 510 may form the network structure during the heat treatment process of the first charge auxiliary layer 182 or the light-emitting material layer 184 of the light-emitting layer 180. In this case, because the heat treatment process for bonding the conductive nanoparticles 510 can be omitted, the process time and costs can be reduced.

The auxiliary pattern 500, formed of the conductive nanoparticles 510, can reduce or prevent the current concentration phenomenon due to the hillock growth, even if the hillock growth is generated in the second layer 162b of the connection pattern 162. This will be described with reference to FIG. 8 and FIG. 9.

Figure 8:
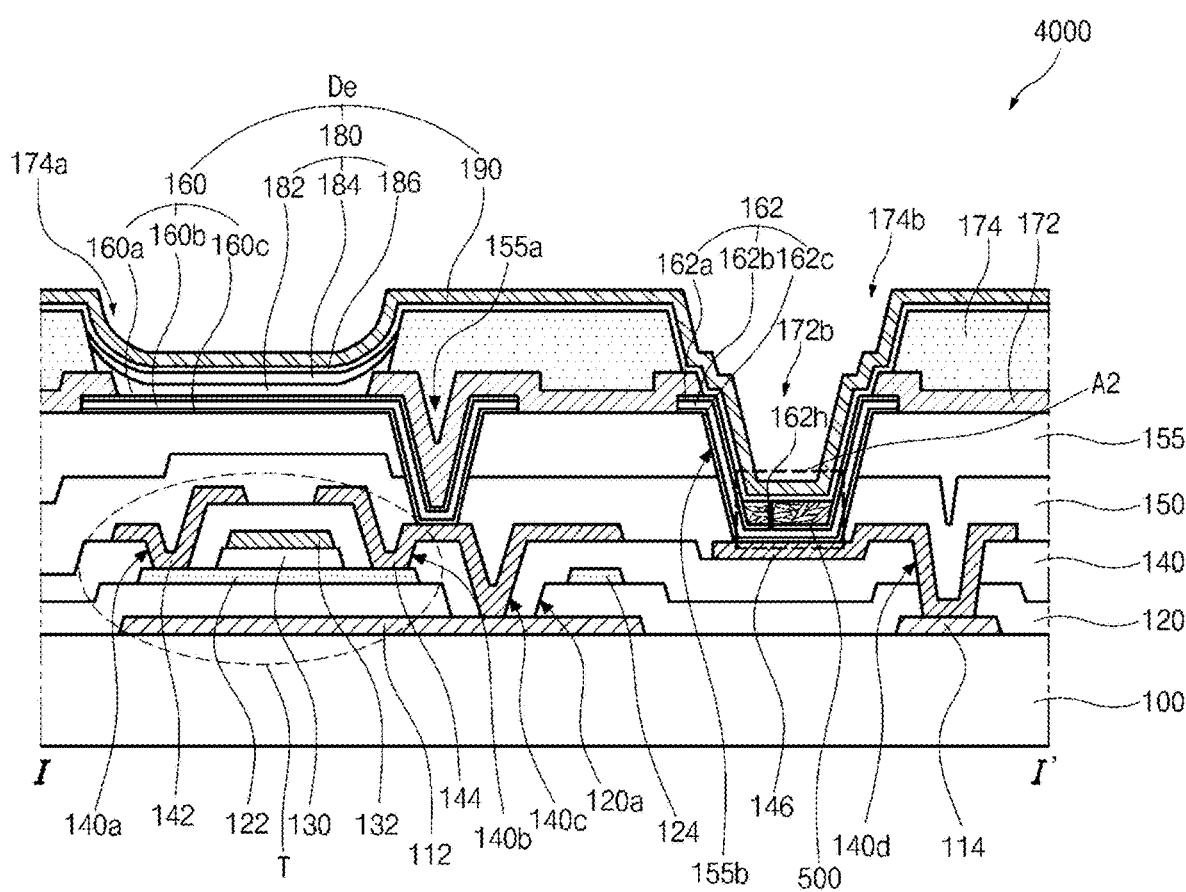
FIG. 8 is a schematic cross-sectional view of an electroluminescent display device according to the fourth embodiment of the present disclosure in which the hillock growth is generated.
Figure 9:
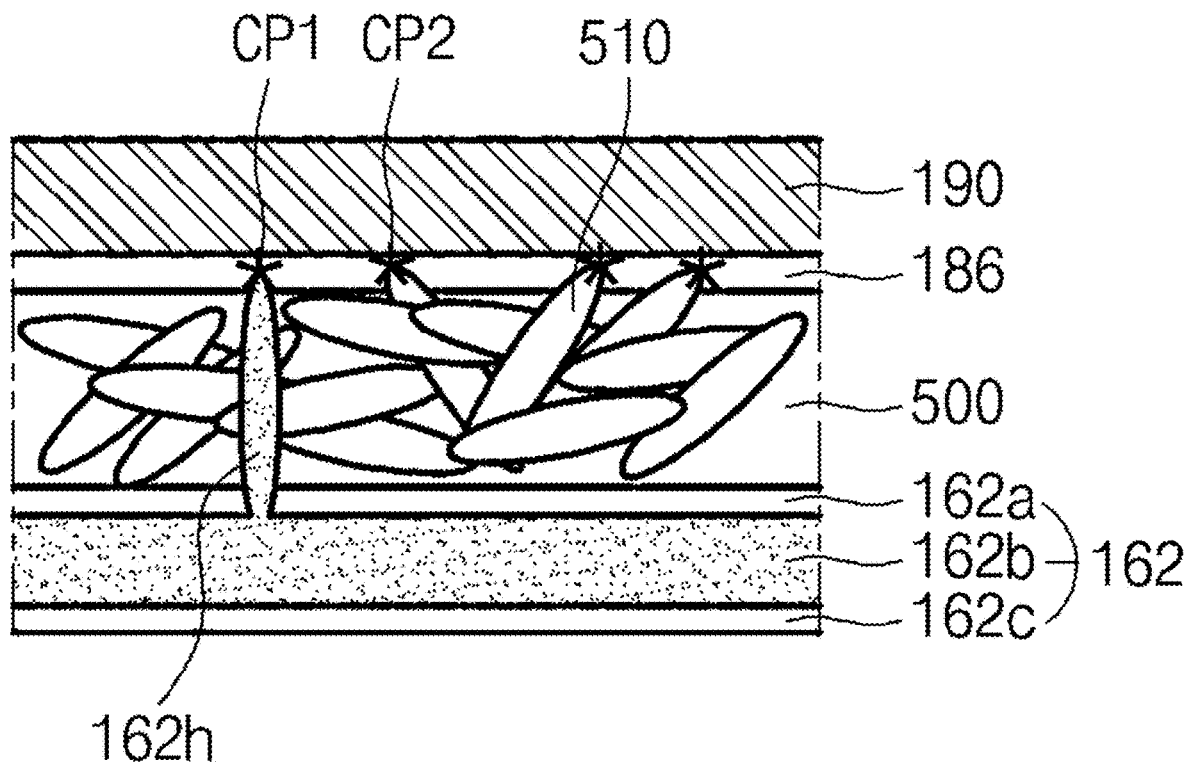
FIG. 9 is a schematic cross-sectional view enlarging the area A2 of FIG. 8.

FIG. 8 is a schematic cross-sectional view of an electroluminescent display device according to the fourth embodiment of the present disclosure in which the hillock growth is generated. FIG. 9 is a schematic cross-sectional view enlarging the area A2 of FIG. 8.

As shown in the examples of FIG. 8 and FIG. 9, the second charge auxiliary layer 186 may be disposed between the connection pattern 162 and the second electrode 190, and the auxiliary pattern 500 may be disposed between the connection pattern 162 and the second charge auxiliary layer 186. The auxiliary layer 500 may be formed of the conductive nanoparticles 510.

The auxiliary pattern 500 may have the unevenness on the top surface thereof due to the conductive nanoparticles 510, and the top surface of the auxiliary pattern 500 may have a higher surface roughness than the top surface of the first layer 162a of the connection pattern 162. Accordingly, some of the conductive nanoparticles 510 may have a shorter length from the second electrode 190 than the others of the conductive nanoparticles 510, or may be in substantially direct contact with the second electrode 190.

A protrusion 162h may be formed in the second layer 162b of the connection pattern 162 due to the hillock growth. The protrusion 162h may grow through the first layer 162a of the connection pattern 162, the auxiliary pattern 500, and the second charge auxiliary layer 186 to thereby contact the second electrode 190. However, in the fourth embodiment of the present disclosure, as shown in FIG. 9, a plurality of contact points CP2 may be generated between the conductive nanoparticles 510 and the second electrode 190, in addition to a contact point CP1 between the protrusion 162h and the second electrode 190, so that it may be possible to reduce or prevent the current concentration phenomenon due to the hillock growth.

As described above, the electroluminescent display device 4000, according to the fourth embodiment of the present disclosure, can be configured as the top-emission type, thereby improving luminance and reducing power consumption. The second electrode 190 may be connected to the first and second auxiliary electrodes 114 and 146 through the connection pattern 162, so that the resistance of the second electrode 190 can be decreased.

The auxiliary pattern 500, of the conductive nanoparticles 510, may be formed between the second electrode 190 and the connection pattern 162, and for example, between the second charge auxiliary layer 186 and the connection pattern 162. As such, the contact properties between the second electrode 190 and the connection pattern 162 can be improved.

In addition, because the auxiliary pattern 500 may be formed of the conductive nanoparticles 510 to have the top surface with the surface roughness, it may be possible to reduce or prevent the current concentration phenomenon due to the hillock growth.

Fifth Embodiment

Figure 10:
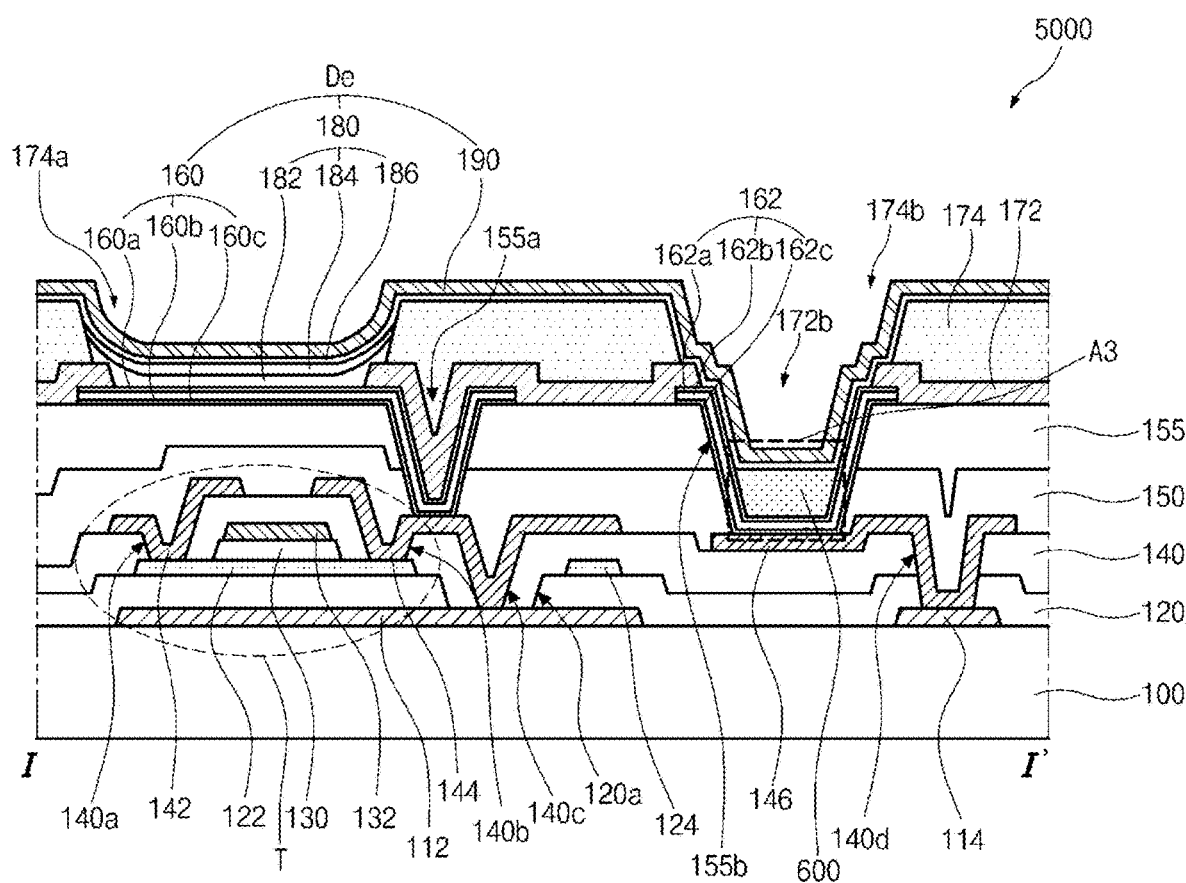
FIG. 10 is a schematic cross-sectional view of an electroluminescent display device according to a fifth embodiment of the present disclosure.
Figure 11:
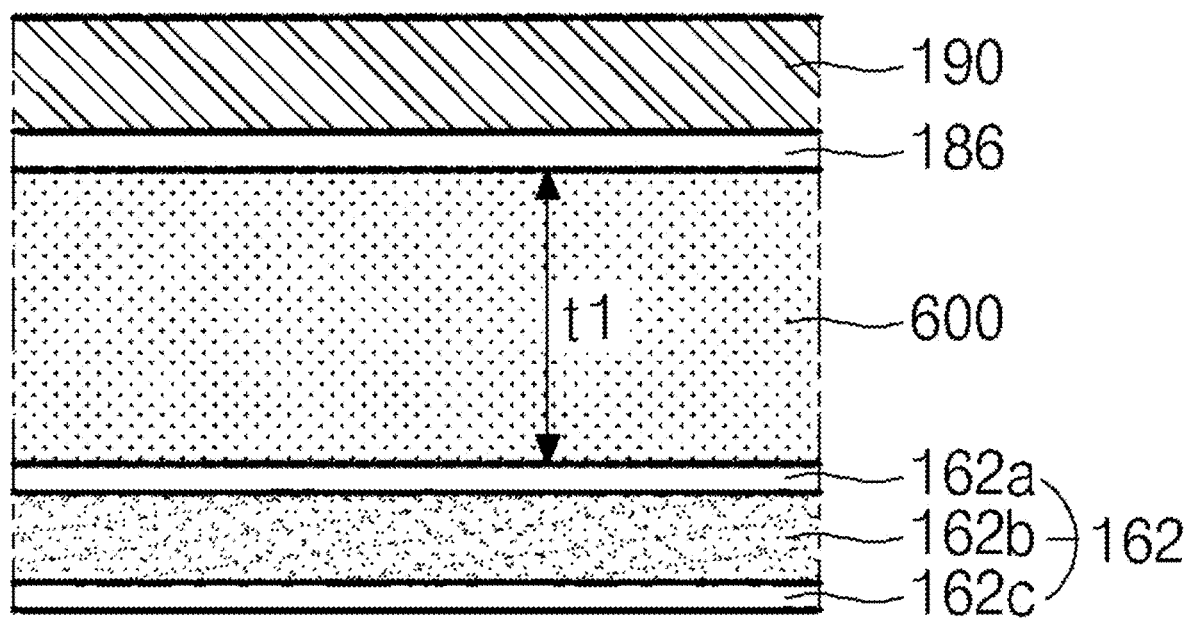
FIG. 11 is a schematic cross-sectional view enlarging the area A3 of FIG. 10.

FIG. 10 is a schematic cross-sectional view of an electroluminescent display device according to a fifth embodiment of the present disclosure. FIG. 11 is a schematic cross-sectional view enlarging the area A3 of FIG. 10.

The electroluminescent display device according to the fifth embodiment of the present disclosure has substantially the same configuration as that of the first embodiment, except for the auxiliary pattern. The same parts as that of the first embodiment are designated by the same reference signs, and explanation for the same parts will be shortened or omitted.

FIG. 10 shows a cross-section corresponding to the line I-I' of FIG. 2. As shown in the examples of FIG. 10 and FIG. 11, in the electroluminescent display device 5000, according to the fifth embodiment of the present disclosure, the first electrode 160, the light-emitting layer 180, and the second electrode 190 may be sequentially formed over the substrate 100 to thereby form the light-emitting diode De. Light from the light-emitting layer 180 of the light-emitting diode De may be output to the outside through the second electrode 190.

To do this, the second electrode 190 can be formed of a metal material, such as aluminum (Al), magnesium (Mg), silver (Ag), or their alloys, and can be relatively thin. For example, the second electrode 190 can have a thickness of 5 nm to 10 nm, but embodiments are not limited thereto. Alternatively, the second electrode 190 can be formed of a transparent conductive material, such as IGO or IZO.

The second electrode 190 may be electrically connected to the connection pattern 162 through the first and second auxiliary contact holes 172b and 174b. Accordingly, the second electrode 190 may be electrically connected to the first and second auxiliary electrodes 114 and 146 through the connection pattern 162.

The second charge auxiliary layer 186 may be disposed between the second electrode 190 and the connection pattern 162. Because the second charge auxiliary layer 186 may have an insulating property, the contact property between the second electrode 190 and the connection pattern 162 may be lowered. Accordingly, to improve the contact property between the second electrode 190 and the connection pattern 162, the auxiliary pattern 600 may be formed between the second electrode 190 and the connection pattern 162, and for example, between the second charge auxiliary layer 186 and the connection pattern 162.

The auxiliary pattern 600 may have a width and size smaller than the connection pattern 162, and may be spaced apart from the first and second banks 172 and 174. In this case, the auxiliary pattern 600 may be disposed in the fifth contact hole 155b.

Alternatively, the auxiliary pattern 600, as in the second or third embodiment, may be in contact with the first and second banks 172 and 174. The auxiliary pattern 600 can have a width corresponding to the connection pattern 162.

The auxiliary pattern 600 may have a relatively thick thickness t1 of 300 nm or more. For example, the thickness t1 of the auxiliary pattern 600 may be 300 nm or more, and 1 μm or less, e.g., 500 nm or more, and 1 μm or less, but embodiments are not limited thereto.

The auxiliary pattern 600 can be formed of a metal having a lower electrical resistivity than the first layer 162a of the connection pattern 162. For example, the auxiliary pattern 600 may be formed of aluminum (Al) or silver (Ag), but embodiments are not limited thereto. Alternatively, the auxiliary pattern 600 can be formed of a metal oxide. The auxiliary pattern 600 of the metal oxide may facilitate the electron injection from the first layer 162a of the connection pattern 162 to the second charge auxiliary layer 186. For example, the auxiliary pattern 600 can be formed of zinc oxide (ZnO) or molybdenum trioxide ($MoO_3$).

The auxiliary pattern 600 of the metal oxide can be formed through the deposition process or the solution process. The zinc oxide can have the form of nanowires.

The auxiliary pattern 600 can reduce or prevent the current concentration phenomenon due to the hillock growth, even if the hillock growth is generated in the second layer 162b of the connection pattern 162. This will be described with reference to FIG. 12 and FIG. 13.

Figure 12:
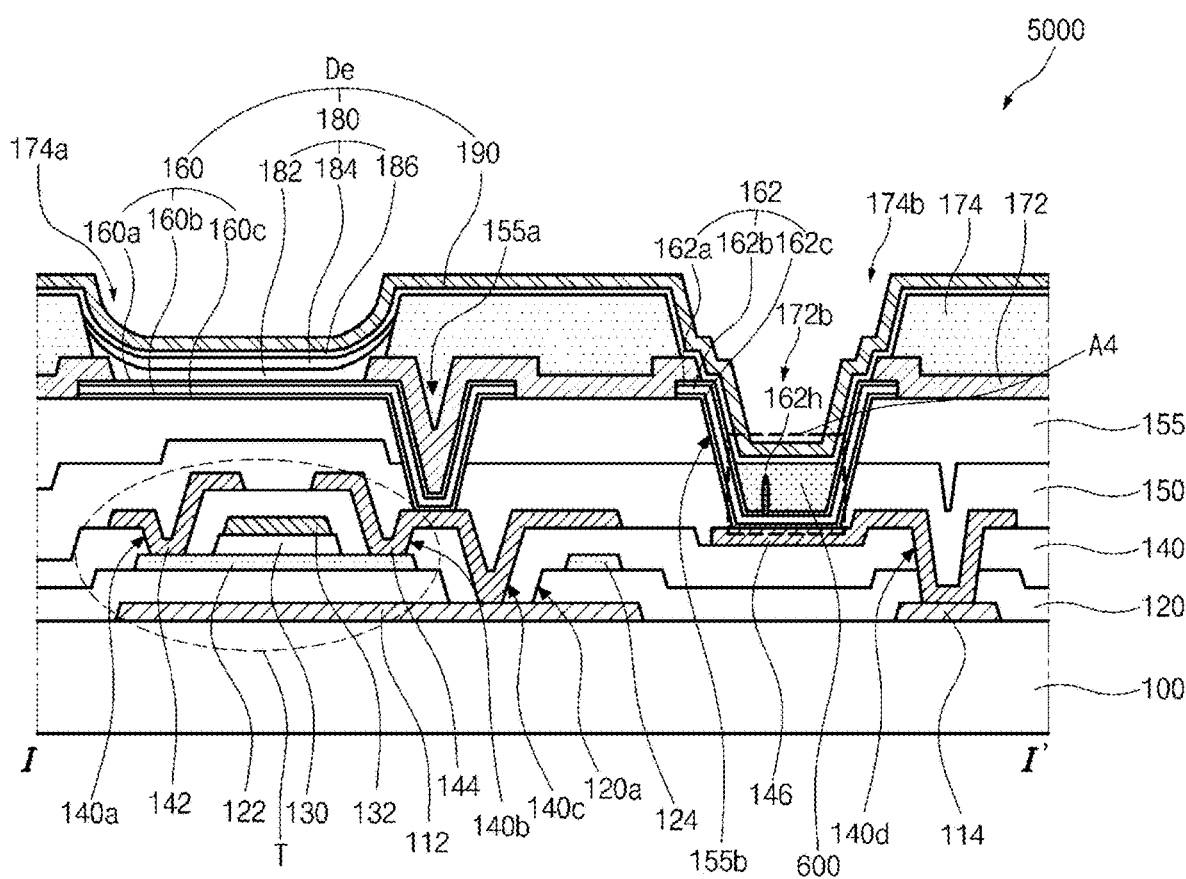
FIG. 12 is a schematic cross-sectional view of an electroluminescent display device according to the fifth embodiment of the present disclosure in which the hillock growth is generated.
Figure 13:
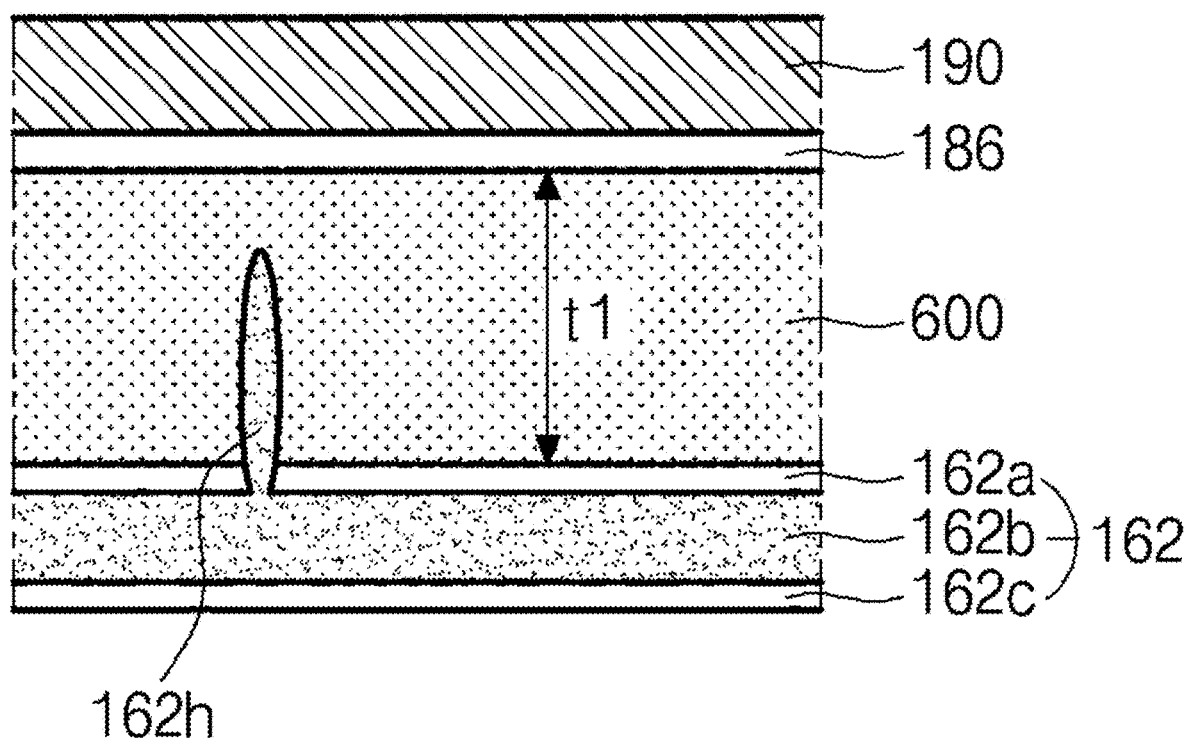
FIG. 13 is a schematic cross-sectional view enlarging the area A4 of FIG. 12.

FIG. 12 is a schematic cross-sectional view of an electroluminescent display device according to the fifth embodiment of the present disclosure in which the hillock growth is generated. FIG. 13 is a schematic cross-sectional view enlarging the area A4 of FIG. 12.

As shown in the examples of FIG. 12 and FIG. 13, the second charge auxiliary layer 186 may be disposed between the connection pattern 162 and the second electrode 190, and the auxiliary pattern 600 may be disposed between the connection pattern 162 and the second charge auxiliary layer 186. The auxiliary layer 600 may have the relatively thick thickness t1. In this case, the thickness t1 of the auxiliary pattern 600 may be greater than the height of the protrusion 162h, which may be generated in the second layer 162b of the connection pattern 162 due to the hillock growth.

Because the auxiliary pattern 600 may have the thickness t1 that is relatively thick and greater than the height of the protrusion 162h, the protrusion 162h can be rediced or prevented from being in contact with the second electrode 190, even if the protrusion 162h is generated due to the hillock growth and grows through the first layer 162a of the connection pattern 162. Accordingly, it may be possible to reduce or prevent the current concentration phenomenon due to the hillock growth.

As described above, the electroluminescent display device 5000, according to the fifth embodiment of the present disclosure, can be configured as the top-emission type, thereby improving luminance and reducing power consumption. The second electrode 190 may be connected to the first and second auxiliary electrodes 114 and 146 through the connection pattern 162, so that the resistance of the second electrode 190 can be decreased.

The auxiliary pattern 600 may be formed between the second electrode 190 and the connection pattern 162, and for example, between the second charge auxiliary layer 186 and the connection pattern 162. As such, the contact properties between the second electrode 190 and the connection pattern 162 can be improved. In addition, because the auxiliary pattern 600 may have the relatively thick thickness to completely cover the protrusion 162h, it may be possible to reduce or prevent the current concentration phenomenon due to the hillock growth.

Sixth Embodiment

Figure 14:
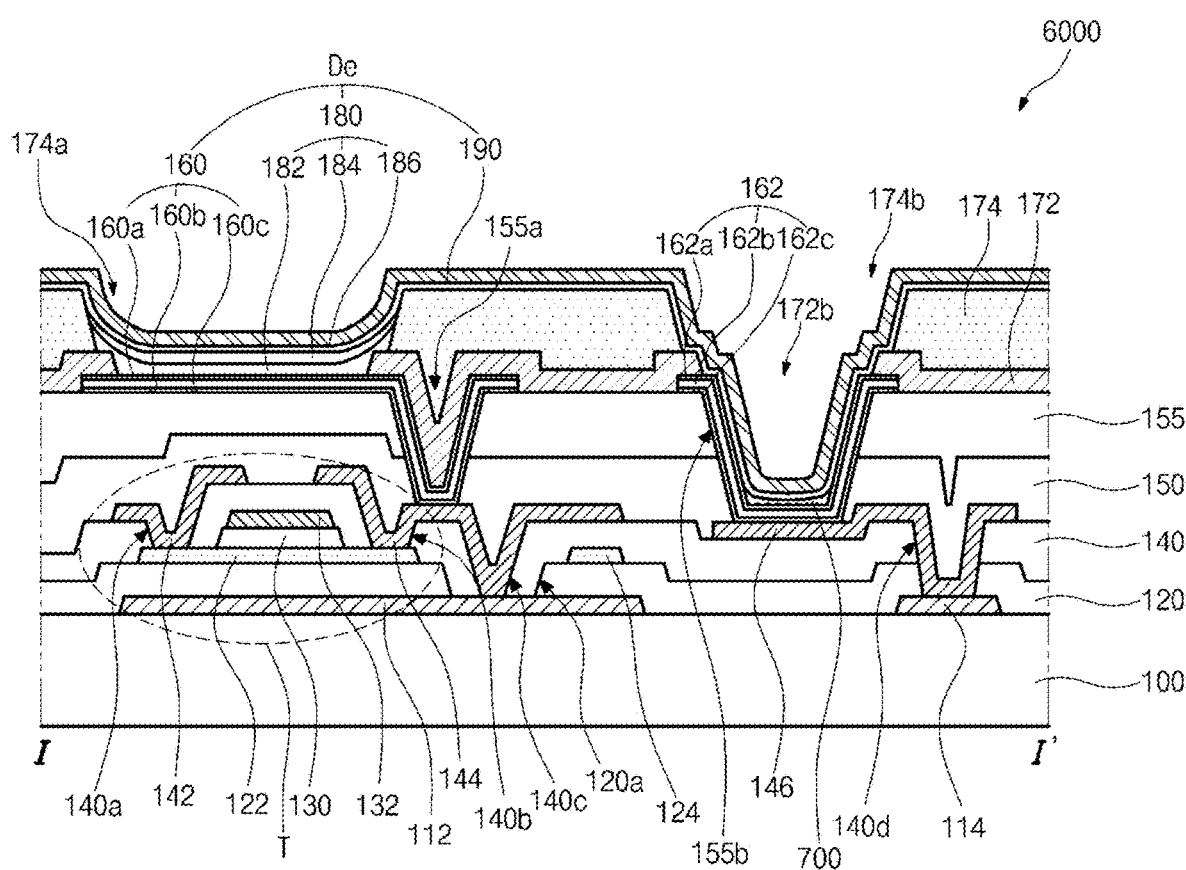
FIG. 14 is a schematic cross-sectional view of an electroluminescent display device according to a sixth embodiment of the present disclosure.

FIG. 14 is a schematic cross-sectional view of an electroluminescent display device according to a sixth embodiment of the present disclosure.

FIG. 14 shows a cross-section corresponding to the line I-I' of FIG. 2. The electroluminescent display device according to the sixth embodiment of the present disclosure has substantially the same configuration as that of the first embodiment, except for the auxiliary pattern. The same parts as that of the first embodiment are designated by the same reference signs, and explanation for the same parts will be shortened or omitted.

As shown in the example of FIG. 14, in the electroluminescent display device 6000, according to the sixth embodiment of the present disclosure, the first electrode 160, the light-emitting layer 180, and the second electrode 190 may be sequentially formed over the substrate 100 to thereby form the light-emitting diode De. Light from the light-emitting layer 180 of the light-emitting diode De may be output to the outside through the second electrode 190.

To do this, the second electrode 190 can be formed of a metal material, such as aluminum (Al), magnesium (Mg), silver (Ag), or their alloys, and can have a relatively thin thickness. For example, the second electrode 190 can have a thickness of 5 nm to 10 nm, but embodiments are not limited thereto. Alternatively, the second electrode 190 can be formed of a transparent conductive material, such as IGO or IZO.

The second electrode 190 may be electrically connected to the connection pattern 162 through the first and second auxiliary contact holes 172b and 174b. Accordingly, the second electrode 190 may be electrically connected to the first and second auxiliary electrodes 114 and 146 through the connection pattern 162.

The second charge auxiliary layer 186 may be disposed between the second electrode 190 and the connection pattern 162. Because the energy level difference between the connection pattern 162 and the second charge auxiliary layer 186 may be relatively large, the electrons may not move smoothly, so that the contact property between the second electrode 190 and the connection pattern 162 can be lowered. In general, for the movement of the electrons and the holes, the energy level difference between adjacent layers may be within 0.5 eV, for example within 0.3 eV.

Accordingly, in the electroluminescent display device 6000, according to the sixth embodiment of the present disclosure, to improve the contact property between the second electrode 190 and the connection pattern 162, the auxiliary pattern 700 may be formed between the second electrode 190 and the connection pattern 162, for example, between the second charge auxiliary layer 186 and the connection pattern 162. The auxiliary pattern 800 may decrease the effective work function of the connection pattern 162. This will be described in detail later.

The auxiliary pattern 700 may have a width and size smaller than the connection pattern 162, and may be spaced apart from the first and second banks 172 and 174. In this case, the auxiliary pattern 700 may be disposed in the fifth contact hole 155b.

Alternatively, the auxiliary pattern 700 may be in contact with the first bank 172, and may be spaced apart from the second bank 174. In this case, the auxiliary pattern 700 may be in contact with only the side surface of the first bank 172, and the width of the auxiliary pattern may be smaller than the width of the connection pattern 162. Otherwise, the auxiliary pattern 700 may be in contact with the first and second banks 172 and 174.

The auxiliary pattern 700 may be formed through the solution process. Accordingly, the height of the auxiliary pattern 700 may increase toward the edge. That is, the height of the auxiliary pattern 700 may be higher at the edge than the center.

The auxiliary pattern 700 may be formed through the same process as one of the first charge auxiliary layer 182 and the light-emitting material layer 184. For example, when the auxiliary pattern 700 is formed through the same process as the first charge auxiliary layer 182, a first solution, including the first charge auxiliary material, may be applied on the first electrode 160, and a second solution, including the auxiliary pattern material, may be applied on the connection pattern 162. Then, the first solution and the second solution may be simultaneously dried, thereby forming the first charge auxiliary layer 182 and the auxiliary pattern 700. Alternatively, when the auxiliary pattern 700 is formed through the same process as the light-emitting material layer 184, a first solution, including a luminescent material, may be applied on the first charge auxiliary layer 182, and a second solution, including the auxiliary pattern material, may be applied on the connection pattern 162. Then, the first solution and the second solution may be simultaneously dried, thereby forming the light-emitting material layer 184 and the auxiliary pattern 700. For example, the auxiliary pattern 700 may be formed through the same drying process as the first charge auxiliary layer 182 and the light-emitting material layer 184. When the first charge auxiliary layer 182 includes the hole injecting layer and the hole transporting layer, the auxiliary pattern 700 may be formed through the same process as the hole injecting layer or the hole transporting layer.

The thickness of the auxiliary pattern 700 can be 5 nm or less. That is, the thickness of the auxiliary pattern 700 may be more than 0 nm and equal to or less than 5 nm.

The auxiliary pattern 700 may be formed of a work function-modifying polymer. The work function-modifying polymer may be polyethylenimine ethoxylated (PEIE), which may be expressed by the following Formula 1.

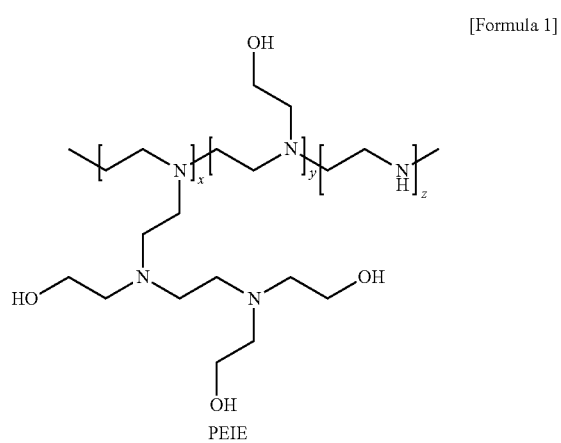

[Formula 1]

PEIE

In Formula 1, x, y, and z, which are repeating units, may each independently be an integer of 1 to 50.

Alternatively, the work function-modifying polymer may be polyethylenimine (PEI), which may be expressed by the following Formula 2.

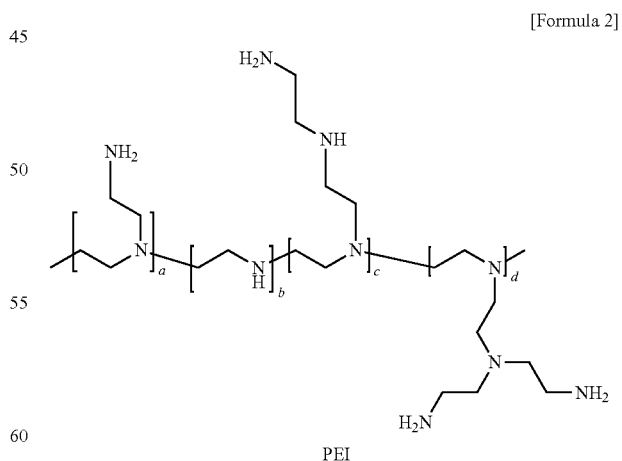

[Formula 2]

PEI

In Formula 2, a, b, c, and d, which are repeating units, may each independently be an integer of 1 to 50.

For example, PEI may be a material expressed by the following Formula 3 in which each of a, b, c, and d is 1.

[Formula 3]

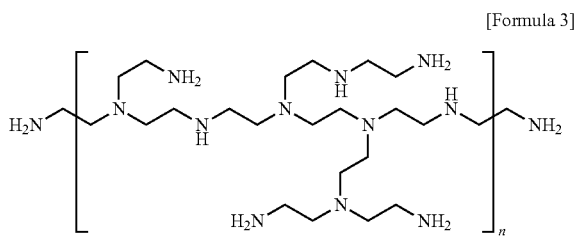

In Formula 3, n is an integer of 1 or more.

The work function-modifying polymer may lower the effective work function of an electrode by inducing dipoles at a surface of the electrode. Accordingly, the effective work function of the connection pattern 162 may be lowered by the auxiliary pattern 700 formed of the work function-modifying polymer, so that the electron injection from the connection pattern 162 to the second charge auxiliary layer 186 can be facilitated.

The work function of the connection pattern 162, that is, the work function of the first layer 162a, may be 4.7 eV to 5.3 eV. The effective work function of the connection pattern 162, that is, the effective work function of the first layer 162a, may be 3.2 eV to 3.8 eV.

In addition, when the second charge auxiliary layer 186 includes an electron injecting layer and an electron transporting layer, and the electron transporting layer is formed of a single electron transporting material, the LUMO level of the electron transporting layer may be −3.3 eV to −2.4 eV. Alternatively, when the second charge auxiliary layer 186 includes an electron injecting layer and an electron transporting layer, and the electron transporting layer is formed of co-deposited first and second electron transporting materials, the LUMO level of the electron transporting layer may be −3.4 eV to −3.0 eV.

The configuration of modifying the effective work function of the connection pattern 162 by the auxiliary pattern 700 will be described in detail with reference to drawings.

Figure 15:
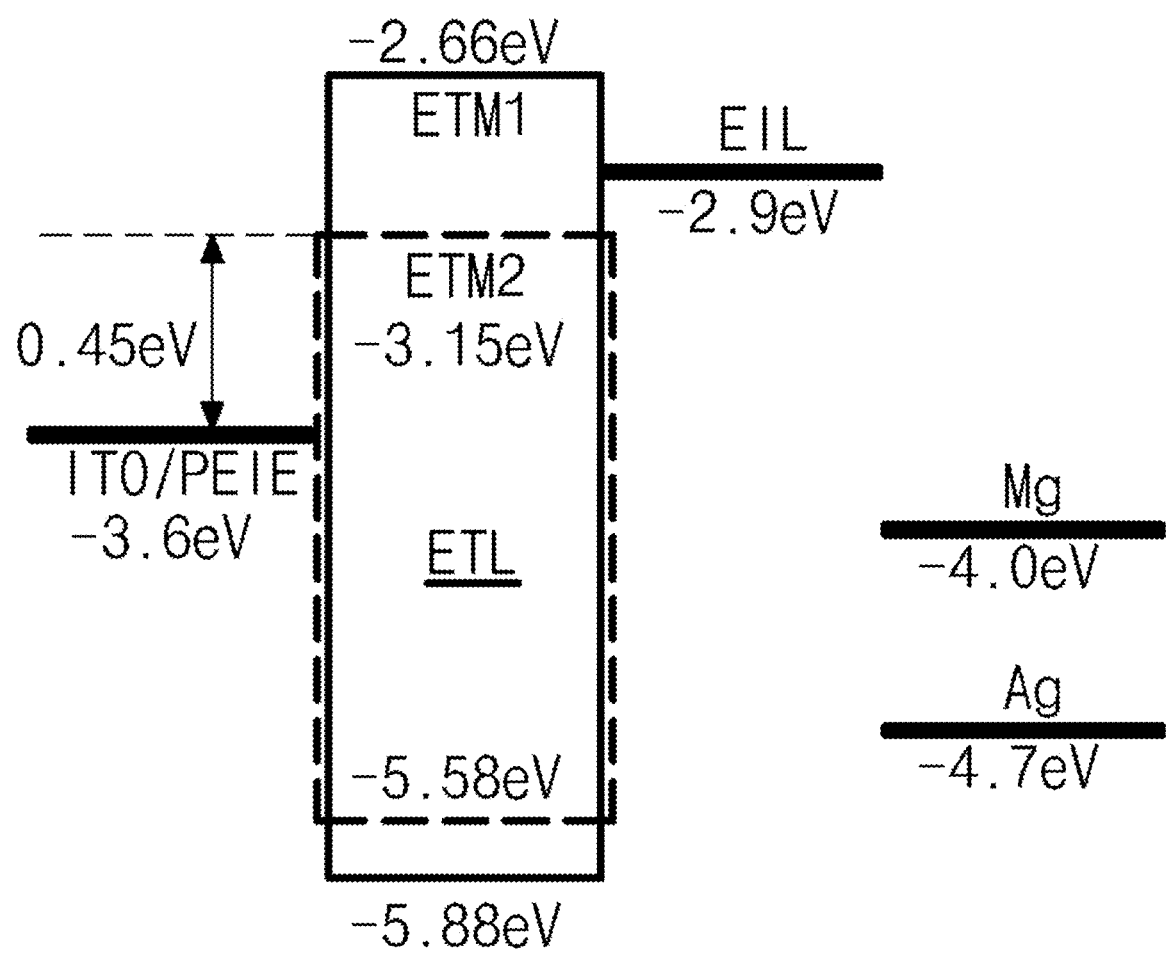
FIG. 15 is a band diagram showing a connection structure between a second electrode and a connection pattern of an electroluminescent display device according to the sixth embodiment of the present disclosure.
Figure 16:
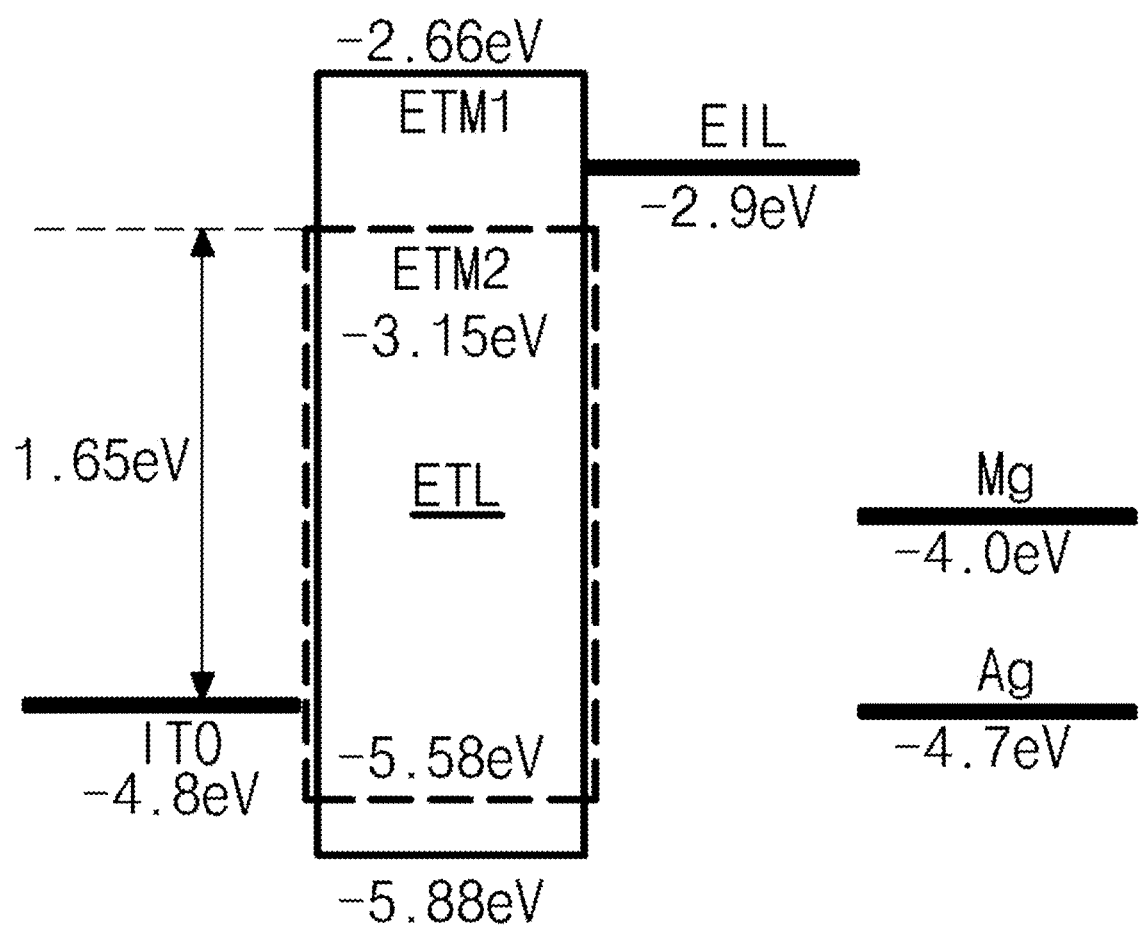
FIG. 16 is a band diagram showing a connection structure between a second electrode and a connection pattern of an electroluminescent display device according to a comparative example.

FIG. 15 is a band diagram showing a connection structure between a second electrode and a connection pattern of an electroluminescent display device according to the sixth embodiment of the present disclosure. FIG. 16 is a band diagram showing a connection structure between a second electrode and a connection pattern of an electroluminescent display device according to a comparative example.

FIGS. 14-16 will be referred to together. The connection pattern 162, that is, the first layer 162a, may be formed of ITO. The second electrode 190 may be formed of magnesium (Mg) and silver (Ag), and the auxiliary pattern 700 may be formed of PEIE.

In addition, the second charge auxiliary layer 186 may include an electron injecting layer EIL and an electron transporting layer ETL. The electron injecting layer EIL may be formed of lithium fluoride, and the electron transporting layer ETL may be formed of first and second electron transporting materials ETM1 and ETM2. The LUMO level of the second electron transporting material ETM2 may be lower than the LUMO level of the first electron transporting material ETM1, and the second electron transporting material ETM2 may be lithium quinolate (Liq).

As shown in the example of FIG. 15, in the electroluminescent display device according to the sixth embodiment of the present disclosure, the auxiliary pattern 700 of PEIE may be disposed between the electron transporting layer ETL and the connection pattern 162, and the effective work function of the connection pattern 162 may be 3.6 eV. Accordingly, the difference between the effective work function of the connection pattern 162 and the LUMO level of the second electron transporting material ETM2 may be 0.45 eV, so that the electron injection from the connection pattern 162 to the electron transporting layer ETL can be facilitated.

On the other hand, as shown in FIG. 16, in the electroluminescent display device 600 according to the comparative example, the work function of the connection pattern 162 is 4.8 eV. In this case, because the difference between the work function of the connection pattern 162 and the LUMO level of the second electron transporting material ETM2 is 1.65 eV, it is difficult to inject the electrons from the connection pattern 162 to the electron transporting layer ETL in the comparative example. Thus, the contact property between the second electrode 190 and the connection pattern 162 in the comparative example is lowered.

As described above, in the electroluminescent display device 6000, according to the sixth embodiment of the present disclosure, the auxiliary pattern 700 of the work function-modifying polymer may be formed between the second electrode 190 and the connection pattern 162, for example, between the second charge auxiliary layer 186 and the connection pattern 162, to thereby lower the effective work function of the connection pattern 162, so that it may be possible to improve the contact property between the second electrode 190 and the connection pattern 162. Further, because the auxiliary pattern 700 can be formed through the same drying process as the first charge auxiliary layer 182 or the light-emitting material layer 184, the manufacturing process can be simplified.

In the electroluminescent display device according to the sixth embodiment of the present disclosure, the work function-modifying polymer may not be formed on the light-emitting material layer 184. This will be described with reference to FIG. 17.

Figure 17:
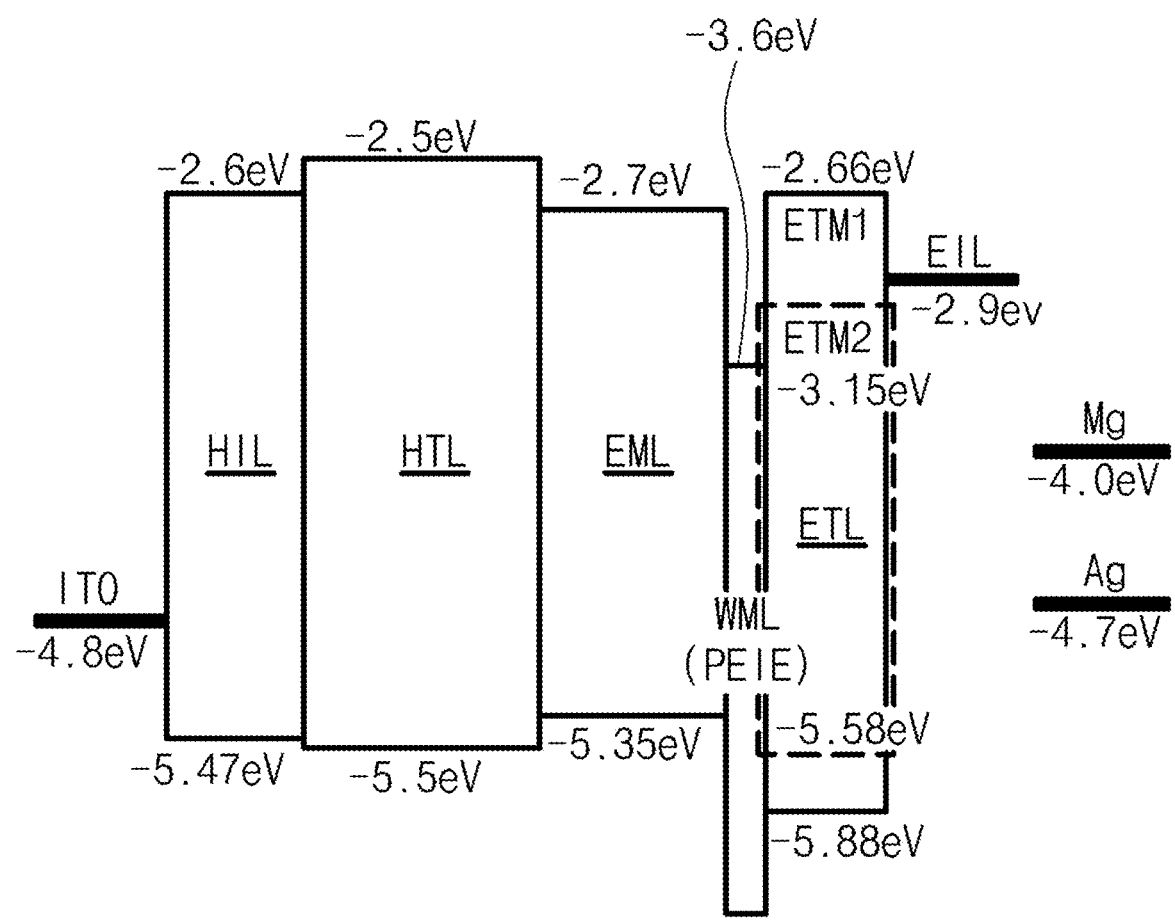
FIG. 17 is a band diagram of a light-emitting diode according to another comparative example.

FIG. 17 is a band diagram of a light-emitting diode according to another comparative example.

As shown in FIG. 17, the light-emitting diode according to another comparative example further includes the work function-modifying polymer layer WML formed of PEIE between the light-emitting material layer EML and the second charge auxiliary layer, that is, the electron transporting layer ETL compared with the light-emitting diode De of FIG. 14. In this case, the difference between the LUMO levels of the light-emitting material layer EML and the work function-modifying polymer layer WML is greater than the difference between the LUMO levels of the light-emitting material layer EML and the second electron transporting material ETM2.

Accordingly, in the light-emitting diode according to another comparative example, because the work function-modifying polymer layer WML interferes with the electron injection from the electron transporting layer ETL to the light-emitting material layer EML, it is desirable that the work function-modifying polymer layer WML not be formed between the light-emitting material layer EML and the electron transporting layer ETL.

In embodiments of the present disclosure, by forming the light-emitting layer of each sub-pixel through the solution process, a mask may be omitted. As such, manufacturing costs may be reduced, and a display device with a large size and high definition can be implemented.

In addition, the light-emitting layers of the same color sub-pixels may be connected to each other and formed as one body, thereby reducing or minimizing the deviation in the dropping amount between nozzles, and uniformly forming the thicknesses of the light-emitting layers of respective sub-pixels. Therefore, a mura may be reduced or prevented, thereby effectively ameliorating or preventing the image quality of the display device from being lowered.

Moreover, the second electrode may be connected to the auxiliary electrode through the connection pattern, thereby lowering the resistance of the second electrode. Also, the auxiliary pattern may be formed between the second electrode and the connection pattern, thereby improving the electrical contact property between the second electrode and the connection pattern.

Further, the unevenness may be formed at the top surface of the auxiliary pattern, or the auxiliary pattern may be relatively thick. Thus, the current concentration phenomenon due to the hillock growth can be prevented.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. An electroluminescent display device, comprising:
   a substrate;
   a first electrode on the substrate;
   a connection pattern on the substrate, the connection pattern comprising a same material as the first electrode;
   a bank covering edges of the first electrode and the connection pattern;
   a light-emitting layer on the first electrode;
   a second electrode on the light-emitting layer, the bank, and the connection pattern; and
   an auxiliary pattern between the connection pattern and the second electrode, the auxiliary pattern comprising one or more of: a metal oxide, conductive nanoparticles, and a work function-modifying polymer.

2. The electroluminescent display device of claim 1, wherein:
   the metal oxide comprises one or more of: zinc oxide and molybdenum trioxide; and
   the conductive nanoparticles comprise one or more of: metal nanorods, metal nanowires, metal nanodots, and carbon nanotubes.

3. The electroluminescent display device of claim 1, wherein the work function-modifying polymer comprises polyethylenimine ethoxylated (PEIE), expressed by the following Formula 1:

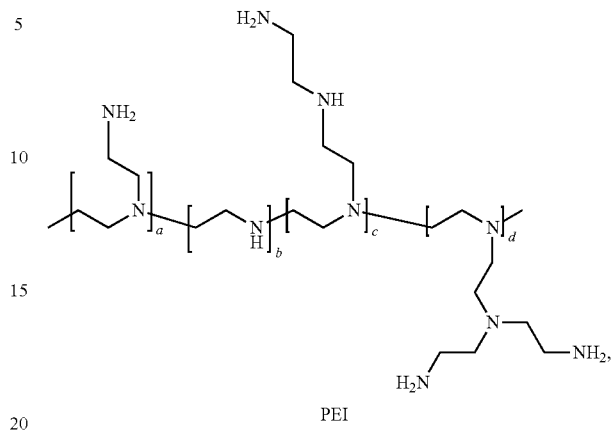

PEIE and polyethylenimine (PEI), expressed by the following Formula 2:

PEI wherein x, y, and z are repeating units, each independently an integer of 1 to 50, and wherein a, b, c, and d are repeating units, each independently an integer of 1 to 50.

4. The electroluminescent display device of claim 1, wherein a height of the auxiliary pattern is higher at an edge than a center.

5. The electroluminescent display device of claim 1, wherein the auxiliary pattern is in contact with the bank.

6. The electroluminescent display device of claim 1, wherein:
   the bank comprises:
      a first bank having a hydrophilic property; and
      a second bank having a hydrophobic property; and
   the auxiliary pattern is between the first bank and the second bank.

7. An electroluminescent display device, comprising:
   a substrate;
   a first electrode on the substrate;
   a connection pattern on the substrate, the connection pattern comprising a same material as the first electrode;
   a bank covering edges of the first electrode and the connection pattern;
   a light-emitting layer on the first electrode;
   a second electrode on the light-emitting layer, the bank, and the connection pattern; and
   an auxiliary pattern between the connection pattern and the second electrode,
   wherein the connection pattern has a protrusion, and
   wherein the protrusion is disposed within the auxiliary pattern.

8. The electroluminescent display device of claim 7, wherein a top surface of the auxiliary pattern has unevenness.

9. The electroluminescent display device of claim 7, wherein a surface roughness of the auxiliary pattern is higher than a surface roughness of the connection pattern.

10. The electroluminescent display device of claim 7, wherein a thickness of the auxiliary pattern is greater than a height of the protrusion.

11. The electroluminescent display device of claim 10, wherein the thickness of the auxiliary pattern is 300 nm or more, and 1 μm or less.

12. The electroluminescent display device of claim 7, wherein the auxiliary pattern is in contact with the bank.

13. The electroluminescent display device of claim 7, wherein:
each of the first electrode and the connection pattern comprises:
a first layer; and
a second layer;
the second layer is between the substrate and the first layer; and
the first layer has a higher work function than the second layer.

14. The electroluminescent display device of claim 13, wherein each of the first electrode and the connection pattern further comprises a third layer between the second layer and the substrate.

15. The electroluminescent display device of claim 7, wherein:
the light-emitting layer comprises:
a hole auxiliary layer;
a light-emitting material layer; and
an electron auxiliary layer;
at least one side surface of each of the hole auxiliary layer and the light-emitting material layer is enclosed by the bank; and
a part of the electron auxiliary layer is between the bank and the second electrode, and between the auxiliary pattern and the second electrode.

16. The electroluminescent display device of claim 7, further comprising:
at least one thin film transistor between the substrate and the first electrode,
wherein the first electrode is connected to the at least one thin film transistor.

17. The electroluminescent display device of claim 7, wherein the bank comprises:
a first bank having a hydrophilic property; and
a second bank having a hydrophobic property.

18. The electroluminescent display device of claim 17, wherein the auxiliary pattern is between the first bank and the second bank.

19. The electroluminescent display device of claim 17, wherein the first bank and the second bank are formed as one body.

20. The electroluminescent display device of claim 17, wherein light-emitting layers in adjacent pixel regions along one direction are connected to each other as one body.

* * * * *